(12) United States Patent
Yamagishi et al.

(10) Patent No.: US 7,960,494 B2
(45) Date of Patent: Jun. 14, 2011

(54) COPOLYMER FOR SEMICONDUCTOR LITHOGRAPHY AND PROCESS FOR PRODUCING THE SAME

(75) Inventors: Takanori Yamagishi, Ichihara (JP); Masaaki Kudo, Ichihara (JP); Satoshi Yamaguchi, Chuo-ku (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 85 days.

(21) Appl. No.: 12/516,489

(22) PCT Filed: Dec. 5, 2007

(86) PCT No.: PCT/JP2007/001353
§ 371 (c)(1),
(2), (4) Date: May 27, 2009

(87) PCT Pub. No.: WO2008/068903
PCT Pub. Date: Jun. 12, 2008

(65) Prior Publication Data
US 2009/0306328 A1 Dec. 10, 2009

(30) Foreign Application Priority Data
Dec. 6, 2006 (JP) .................................. 2006-329535

(51) Int. Cl.
*C08G 63/02* (2006.01)
*C08G 63/00* (2006.01)

(52) U.S. Cl. ............... 528/272; 430/270.1; 524/150; 524/160; 526/266; 526/286; 528/271; 528/480

(58) Field of Classification Search ............. 430/270.1; 524/150, 160; 526/266, 286; 528/271, 272, 528/480
See application file for complete search history.

(56) References Cited

U.S. PATENT DOCUMENTS

| | | | |
|---|---|---|---|
| 4,491,628 A | 1/1985 | Ito et al. | |
| 4,603,101 A | 7/1986 | Crivello | |
| 5,069,997 A | 12/1991 | Schwalm et al. | |
| 5,118,585 A | 6/1992 | Schwalm et al. | |
| 5,968,713 A | 10/1999 | Nozaki et al. | |
| 6,013,416 A | 1/2000 | Nozaki et al. | |
| 6,200,725 B1 | 3/2001 | Takechi et al. | |
| 6,242,161 B1 | 6/2001 | Kawaguchi et al. | |
| 6,329,125 B2 | 12/2001 | Takechi et al. | |
| 6,388,101 B1 | 5/2002 | Hada et al. | |
| 6,489,432 B2 | 12/2002 | Jung et al. | |
| 6,706,826 B1 | 3/2004 | Fujiwara et al. | |
| 6,780,953 B2 | 8/2004 | Jung et al. | |
| 7,186,495 B2 | 3/2007 | Maeda et al. | |
| 7,432,035 B2 | 10/2008 | Maeda et al. | |
| 7,517,633 B2 | 4/2009 | Takei et al. | |
| 2004/0167298 A1 | 8/2004 | Yamagishi et al. | |
| 2008/0114139 A1 | 5/2008 | Yamagishi et al. | |

FOREIGN PATENT DOCUMENTS

| | | |
|---|---|---|
| JP | 59-45439 | 3/1984 |
| JP | 62-115440 | 5/1987 |
| JP | 5-113667 | 5/1993 |
| JP | 9-73173 | 3/1997 |
| JP | 9-90637 | 4/1997 |
| JP | 10-26828 | 1/1998 |
| JP | 10-161313 | 6/1998 |
| JP | 10-207069 | 8/1998 |
| JP | 2000-26446 | 1/2000 |
| JP | 2000-313779 | 11/2000 |
| JP | 2001-27810 | 1/2001 |
| JP | 2001-192411 | 7/2001 |
| JP | 2001-201856 | 7/2001 |
| JP | 2001-226324 | 8/2001 |
| JP | 2001-242627 | 9/2001 |
| JP | 2002-194029 | 7/2002 |
| JP | 2003-57828 | 2/2003 |
| JP | 2003 186196 | 7/2003 |
| JP | 2003-246825 | 9/2003 |
| JP | 2004 231950 | 8/2004 |
| JP | 2004 269855 | 9/2004 |
| JP | 2004269855 * | 9/2004 |
| JP | 2006 176573 | 7/2006 |
| JP | 2006-193687 | 7/2006 |
| JP | 2006176573 * | 7/2006 |
| JP | 2006-243308 | 9/2006 |
| WO | WO 99/50322 | 10/1999 |

* cited by examiner

OTHER PUBLICATIONS

U.S. Appl. No. 12/872,461, filed Aug. 31, 2010, Yamagishi, et al.

*Primary Examiner* — Terressa M Boykin
(74) *Attorney, Agent, or Firm* — Oblon, Spivak, McClelland, Maier & Neustadt, L.L.P.

(57) ABSTRACT

To provide a copolymer for semiconductor lithography employed for forming a resist film as well as thin films such as an anti-reflection film, a gap-filling film, a top coating film, etc. which are formed on or under a resist film, these films being employed in semiconductor lithography, wherein the copolymer has excellent solubility in a solution of a thin film-forming composition and prevents generation of microparticles (e.g., microgel) and pattern defects, and to provide a method for producing the copolymer reliably on an industrial scale.

The invention is directed to a copolymer for semiconductor lithography having at least one repeating unit selected from among (A) a repeating unit having a hydroxyl group; (B) a repeating unit having a structure in which a hydroxyl group is protected by a group which inhibits dissolution in an alkaline developer and which dissociates by the action of an acid; (C) a repeating unit having a lactone structure; and (D) a repeating unit having a cyclic ether structure, wherein, when a solution of the copolymer in propylene glycol monomethyl ether acetate having a viscosity of 15 mPa·sec is caused to pass through a filter having a pore size of 0.03 μm under a pressure difference of 0.1 MPa for 60 minutes, the solution exhibits an average flow rate per unit filter area of 200 g/min/m² or more, and to a method for producing the copolymer.

15 Claims, No Drawings

COPOLYMER FOR SEMICONDUCTOR LITHOGRAPHY AND PROCESS FOR PRODUCING THE SAME

TECHNICAL FIELD

The present invention relates to a copolymer for lithography in production of semiconductor devices, and to a method for producing the copolymer. More particularly, the invention relates to a copolymer for use in production of a resist film as well as thin films such as an anti-reflection film, a gap-filling film, a top coating film, etc. which are formed on or under a resist film, these films being employed in a lithography step in production of semiconductor devices, and to a method for producing the copolymer.

BACKGROUND ART

Production of semiconductor devices requires formation of finer lithography patterns for increasing the degree of integration. A key technique for forming such micropatterns is use of a radiation (light) source of short wavelength (as used herein, "light" refers to a type of radiation). In addition to g-rays and i-rays, which have hitherto been used, far-ultraviolet radiations such as krypton fluoride (KrF) excimer laser radiation (wavelength: 248 nm) and argon fluoride (ArF) excimer laser radiation (wavelength: 193 nm) have been introduced for mass production of semiconductor devices. Meanwhile, studies have been conducted on lithography techniques employing, as a radiation source, fluorine dimer ($F_2$) excimer laser radiation (157 nm), extreme ultraviolet radiation (EUV), an electron beam (EB), or the like.

In the lithographic techniques, a resist film is employed for transferring a pattern to a substrate, and a variety of thin films may be optionally attached on or under the resist film. These thin films are formed through preparing a composition containing a copolymer having a function of interest and an additive dissolved in an organic solvent, applying the composition to a substrate through spin-coating or a similar technique, and removing the solvent or curing the composition by heating as needed.

Resist films are divided into two types: a positive type resist; i.e., an irradiated portion is dissolved in a developer, and a negative type resist; i.e., a non-irradiated portion is dissolved in a developer. There have also been known, for example, a resist containing a compound whose solubility in a developer is varied by the effect of radiation, and, as a binder, a polymer which is soluble in an alkaline developer; a resist containing a compound which generates an acid by the effect of radiation (hereinafter may be referred to as "radiation-sensitive acid-generator"), and, as a binder, a copolymer whose solubility in an alkaline developer is varied by the action of an acid. Particularly, the latter resist is called a chemical amplification-type resist, inter alia, a chemical amplification-type positive resist is particularly preferably employed in fine pattern processing.

As thin films formed on or under the resist film, there have been known, for example, an anti-reflection film, a gap-filling film, and a top coating film. The anti-reflection film is provided on a surface of a high-reflective substrate (forming a layer under the resist film) or a surface of the resist film (forming a layer on the resist film), to thereby suppress light reflection at the interface between the resist film and the reflective substrate and a standing wave, whereby fine resist patterns are accurately formed. The gap-filling film is provided on a surface of a substrate (forming a layer under the resist film or an anti-reflection film) in resist pattern formation on the pattern-formed substrate, whereby gaps present in the substrate surface are filled therewith, to thereby planarize the surface. The top coating film is provided on the resist film in immersion photolithography, in order to prevent migration of immersion liquid to the resist film and release of components such as a radiation-sensitive acid-generator from the resist film.

In the aforementioned composition in solution form for forming thin film, the copolymer for lithography is an important component which is required to have optical, chemical, and physical properties so as to exhibit a function of interest to the thin film. Thus, extensive studies on the copolymer for lithography are currently being carried out.

For example, as has been known, a chemical amplification-type positive resist with a KrF excimer laser serving as an exposure light source employs, for example, a copolymer having a repeating unit derived from hydroxystyrene; and a repeating unit in which a phenolic hydroxyl group derived from hydroxystyrene is protected by a group which inhibits dissolution in an alkaline developer and which dissociates by the action of an acid (hereinafter referred to as an "acid-dissociable dissolution-inhibitive group") (e.g., an acetal structure or a tertiary hydrocarbon group), or a repeating unit in which a carboxyl group derived from (α-alkyl) acrylate is protected by an acid-dissociable dissolution-inhibitive group (e.g., an acetal structure or a tertiary hydrocarbon group) (see, for example, Patent Documents 1 to 4). There has also been known a copolymer having a repeating unit in which an alicyclic hydrocarbon group serves as an acid-dissociable dissolution-inhibitive group for increasing the dry etching resistance of the copolymer or for increasing the difference in rate of dissolution of the copolymer in an alkaline developer between before and after light exposure (see, for example, Patent Documents 5 and 6).

As candidates for a chemical amplification-type positive photoresist with ArF excimer laser radiation, there have been studied copolymers having no repeating unit which is derived from hydroxystyrene having a large absorption coefficient with respect to a wavelength of 193 nm. Actually, there have been known such copolymers formed of repeating units having a lactone structure, which is a polar group for enhancing adhesion to a semiconductor substrate or the like and regulating solubility of the copolymers in a solvent for lithography or in an alkaline developer (see, for example, Patent Documents 7 to 10).

As copolymers for forming anti-reflection film, there have been known copolymers formed of repeating units having an aromatic ring (e.g., benzene ring, naphthalene ring, or anthracene ring) serving as a functional group for enhancing absorption coefficients to wavelengths of 248 nm and 193 nm and refractive indexes of the copolymers, and optional repeating units having a reactive functional group (e.g., amino, amide, hydroxyl, or epoxy), which reacts with a curing agent or the like to cause curing, for preventing intermixing with resist film (see, for example, Patent Documents 11 to 14).

As copolymers for forming gap-filling film, there have been known copolymers formed of repeating units having a reactive functional group, which has an appropriate viscosity suitable for pouring into narrow gaps and which reacts with a curing agent or the like to cause curing, for preventing intermixing with resist film or anti-reflection film. One specific example is a copolymer formed of repeating units derived from hydroxystyrene and optional repeating units derived from a polymerizable monomer (e.g., styrene, alkyl (meth) acrylate, or hydroxyalkyl (meth)acrylate) (see, for example, Patent Document 15).

As copolymers for forming top coating film for immersion lithography, there have been known, for example, copolymers formed of repeating units having a carboxyl group (see, for example, Patent Document 16) and copolymers formed of repeating units having a hydroxyl group-substituted fluorine-containing group (see, for example, Patent Document 17).

In a trend for finer device patterns, even minute pattern defects raise problems, and such pattern defects increasingly generate. Thus, measures for reducing such pattern defects are needed. There are a variety of causes for generation of pattern defects. One main cause therefor is that microparticles (e.g., microgel) formed from a component contained in a copolymer are present in a solution for lithography, which component is difficult to dissolve in a solvent for lithography. Examples of such a component include a component having high molecular weight (i.e., a high polymer), a copolymer having a repeating unit composition which falls outside the target range, and a copolymer having a long-chain segment of specific repeating units. Generally, the higher the molecular weight of a polymer is, the lower the solubility thereof in a solvent is. In addition, a balanced solubility of a copolymer which has different types of repeating units having varied solubility parameters can be attained by appropriate compositional proportions and arrangement. However, a copolymer having compositional proportions of the repeating units falling outside the target range and a copolymer having a continuous segment of specific repeating units exhibit low solubility in a solvent. Therefore, extensive studies have been carried out on prevention of formation of a high polymer, a copolymer having a repeating unit composition falling outside a target range, and a copolymer having a continuous segment of specific repeating units.

Known measures are dropwise addition polymerization, in which monomer(s) and a polymerization catalyst or a polymerization initiator are added to a heated solvent, and a copolymer produced through the method, the copolymer having a uniform composition in the same molecular weight component and exhibiting high solubility in a solvent (see, for example, Patent Documents 18 and 19). There have been also known a polymerization method in which the compositional proportions of the monomers to be added are changed before and after dropwise addition, or a part of the monomers is dissolved in advance in a solvent, followed by dropwise addition thereto of the remaining monomers and an initiator with heating, and a copolymer produced through the method, the copolymer not forming a continuous segment of repeating units, having high solubility in a solvent, and forming less microgel in a solution for lithography (see, for example, Patent Documents 20 and 21). Furthermore, there have been also known a polymerization method in which monomers, and a catalyst or an initiator are separately added to a polymerization system, and a copolymer produced through the method, the copolymer not forming a high polymer and forming considerably less microgel in a solution for lithography (see Patent Document 22).

In a trend for making dimension accuracy higher, there is strong demand for reduction of pattern defects. However, application of only these techniques encounters difficulty in satisfying the demand, and reliable production of copolymers for lithographic use is difficult, particularly by means of an industrial-scale facility.

Patent Document 1: JP-A-1984-045439
Patent Document 2: JP-A-1993-113667
Patent Document 3: JP-A-1998-026828
Patent Document 4: JP-A-1987-115440
Patent Document 5: JP-A-1997-073173
Patent Document 6: JP-A-1998-161313
Patent Document 7: JP-A-1997-090637
Patent Document 8: JP-A-1998-207069
Patent Document 9: JP-A-2000-026446
Patent Document 10: JP-A-2001-242627
Patent Document 11: JP-A-2000-313779
Patent Document 12: JP-A-2001-27810
Patent Document 13: JP-A-2001-192411
Patent Document 14: JP-A-2001-226324
Patent Document 15: JP-A-2003-57828
Patent Document 16: JP-A-2006-193687
Patent Document 17: JP-A-2006-243308
Patent Document 18: JP-A-2002-194029
Patent Document 19: WO 1999/050322
Patent Document 20: JP-A-2001-201856
Patent Document 21: JP-A-2003-246825
Patent Document 22: JP-A-2004-269855

DISCLOSURE OF THE INVENTION

Problems to be Solved by the Invention

The present invention has been accomplished in order to solve the aforementioned problems involved in background art, and an object of the invention is to provide a copolymer for semiconductor lithography employed for forming a resist film as well as thin films such as an anti-reflection film, a gap-filling film, a top coating film, etc. which are formed on or under a resist film, these films being employed in semiconductor lithography, wherein the copolymer has excellent solubility in a solution of a thin film-forming composition and prevents generation of microparticles (e.g., microgel) and pattern defects. Another object is to provide a method for producing the copolymer reliably on an industrial scale.

Means for Solving the Problems

The present inventors have carried out extensive studies in order to attain the aforementioned objects, and have found that the objects can be attained by a copolymer exhibiting a refining and filtration rate equal to or higher than a specific value, the refining and filtration being performed under specific conditions, and that the copolymer can be reliably produced through polymerization under specific conditions on an industrial scale. The present invention has been accomplished on the basis of these findings.

Accordingly, the present invention provides a copolymer for semiconductor lithography, having at least one repeating unit selected from among (A) a repeating unit having a hydroxyl group; (B) a repeating unit having a structure in which a hydroxyl group is protected by a group which inhibits dissolution in an alkaline developer and which dissociates by the action of an acid (hereinafter the group may be referred to as "acid-dissociable dissolution-inhibitive group"); (C) a repeating unit having a lactone structure; and (D) a repeating unit having a cyclic ether structure, wherein, when a solution of the copolymer in propylene glycol monomethyl ether acetate (hereinafter may be abbreviated as "PGMEA") having a viscosity of 15 mPa·sec is caused to pass through a filter having a pore size of 0.03 µm under a pressure difference of 0.1 MPa for 60 minutes, the solution exhibits an average flow rate per unit filter area (hereinafter may be referred to as "refining and filtration rate") of 200 g/min/m$^2$ or more.

The invention also provides a method for producing the aforementioned copolymer for semiconductor lithography, including dropwise addition, to a heated solvent, of at least one monomer selected from among a monomer for forming (A) a repeating unit having a hydroxyl group; a monomer for forming (B) a repeating unit having a structure in which a hydroxyl group is protected by an acid-dissociable dissolution-inhibitive group; a monomer for forming (C) a repeating unit having a lactone structure; and a monomer for forming (D) a repeating unit having a cyclic ether structure, and a polymerization initiator, to thereby polymerize the monomer(s), in a polymerization tank having a capacity of 100 L or more and equipped with at least a jacket for supplying a heating medium, an agitator, and a condenser, wherein the temperature of the heating medium supplied to the jacket is controlled so as not to exceed a temperature which is 10° C. higher than the polymerization temperature at least during dropwise addition of the monomer(s).

Effects of the Invention

By use of the copolymer of the present invention, generation of pattern defects in semiconductor lithography can be prevented, whereby highly integrated semiconductor devices can be produced at high yield.

Best Modes for Carrying Out the Invention

The present invention will next be described in detail.
1. Structure of the Copolymer The copolymer of the present invention has at least one repeating unit selected from among (A) a repeating unit having a hydroxyl group, (B) a repeating unit having a structure in which a hydroxyl group is protected by an acid-dissociable dissolution-inhibitive group, (C) a repeating unit having a lactone structure, and (D) a repeating unit having a cyclic ether structure. If required, the copolymer may further contain, for example, (E) a repeating unit having a structure which inhibits dissolution of the copolymer in an alkaline developer and is stable to the action of acid (hereinafter such a structure may be referred to as "acid-stable dissolution-inhibitive structure"). These repeating units may be selected in accordance with the purpose of a target thin film employed in semiconductor lithography.

For example, when the copolymer is employed for forming a chemical amplification-type positive resist film, the copolymer essentially has at least one member selected from repeating units (A) and (C); repeating unit (B); and optionally repeating unit (E) in accordance with needs. When the copolymer is employed for forming a negative resist film, the copolymer essentially has at least one member selected from repeating units (A) and (D); and optionally at least one member selected from repeating units (C) and (E) in accordance with needs. When the copolymer is employed for forming an anti-reflection film or a top coating film for immersion lithography, the copolymer essentially has at least one member selected from repeating units (A) and (D); and optionally at least one member selected from repeating units (B), (C), and (E) in accordance with needs.

(1) Repeating Unit (A)

Repeating unit (A), having a hydroxyl group, enhances adhesion of the copolymer to a substrate or an underlying film, controls solubility of the copolymer in a solvent for lithography or an alkaline developer, and reacts with a curing agent to form a cross-linking structure. The hydroxyl group may be linked to a linear, branched, or cyclic hydrocarbon group which may be substituted by halogen, a carbonyl group, a sulfonyl group, etc. Specific examples of such groups include alcoholic hydroxyl groups, phenolic hydroxyl groups, fluoroalcoholic hydroxyl groups, a carboxyl group, and a sulfo group. Among them, alcoholic hydroxyl groups, phenolic hydroxyl groups, fluoroalcoholic hydroxyl groups, and a carboxyl group are preferred.

The repeating unit (A) particularly preferably has a structure represented by any of the formulas (A1) to (A3).

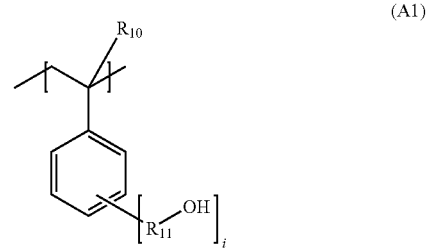

In formula (A1), $R_{10}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, or trifluoromethyl being preferred; $R_{11}$ represents a single bond or a C1-C4 divalent hydrocarbon group which may be substituted by a fluorine atom; specifically, a single bond, or a C1-C4 alkylene group such as methylene, 1,1-ethylene, 2,2-propylene, 1,1,1,3,3,3-hexafluoro-2,2-propylene, or 1,1,1-trifluoro-2-trifluoromethyl-2,3-propylene, with a single bond, 1,1,1,3,3,3-hexafluoro-2,2-propylene, or 1,1,1-trifluoro-2-trifluoromethyl-2,3-propylene being preferred and a single bond being particularly preferred; and i is an integer of 1 or 2.

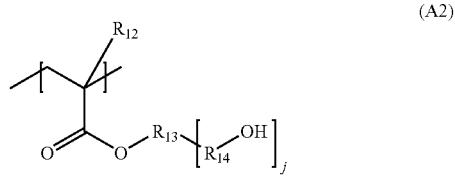

In formula (A2), $R_{12}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl, with a hydrogen atom, methyl, or trifluoromethyl being preferred; $R_{13}$ represents a C2-C12 2- to 4-valent hydrocarbon group which may include a fluorine atom, an oxygen atom, or a sulfur atom; specifically, a linear or branched saturated hydrocarbon group such as ethylene or isopropylene or a saturated alicyclic hydrocarbon group having, for example, a cyclohexane ring, a norbornane ring, a 7-oxa-norbornane ring, a 7-thia-norbornane ring, an adamantane ring, or a tetracyclo[4.4.0.1$^{2,5}$.1$^{7,10}$]dodecane ring, with a cyclohexane ring, a norbornane ring, or an adamantane ring being preferred; $R_{14}$ represents a single bond or a C1-C4 divalent hydrocarbon group which may be substituted by a fluorine atom; specifically, a single bond, or a C1-C4 alkylene group such as methylene, 1,1-ethylene, 2,2-propylene, 1,1,1,3,3,3-hexafluoro-2,2-propylene, or 1,1,1-trifluoro-2-trifluoromethyl-2,3-propylene, with a single bond, 1,1,1,3,3,3-hexafluoro-2,2-propylene, or 1,1,1-trifluoro-2-trifluoromethyl-2,3-propylene being preferred, and a case in which $R_{13}$ is an adamantyl group and $R_{14}$ is a single bond being particularly preferred; and j is an integer of 1 to 3.

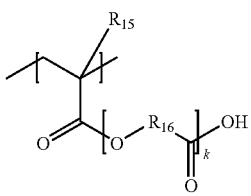
(A3)

In formula (A3), $R_{15}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, or trifluoromethyl being preferred; $R_{16}$ represents a C6-C12 divalent alicyclic hydrocarbon group which may include an oxygen atom or a sulfur atom; specifically, a saturated alicyclic hydrocarbon group having, for example, a norbornane ring, a 7-oxa-norbornane ring, a 7-thia-norbornane ring, or a tetracyclo[4.4.0.1$^{2,5}$.1$^{7,10}$]dodecane ring, with a norbornane ring or a tetracyclo[4.4.0.1$^{2,5}$.1$^{7,10}$]dodecane ring being preferred; and k is an integer of 0 or 1.

Specific examples of repeating unit (A) will next be described. However, the present invention is not limited to those examples. Among specific repeating units (A), one single or a plurality of different members may be selected.

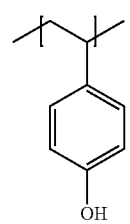
(A101)

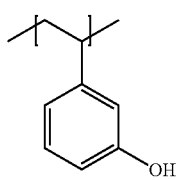
(A102)

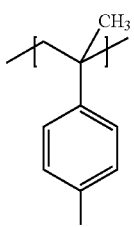
(A103)

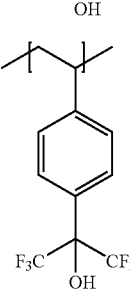
(A103)

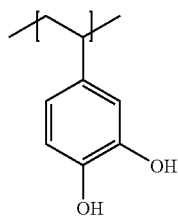
(A104)

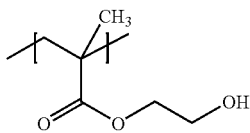
(A201)

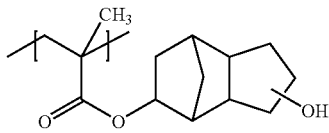
(A202)

(A211)

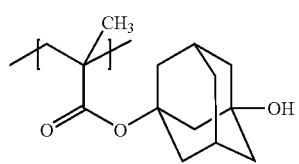
(A203)

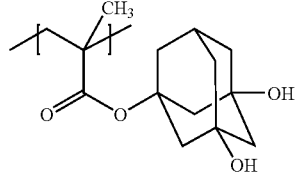
(A204)

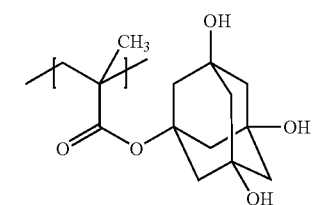
(A205)

(A206)

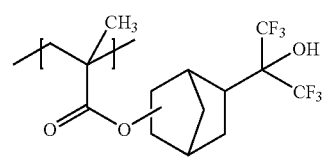
(A207)

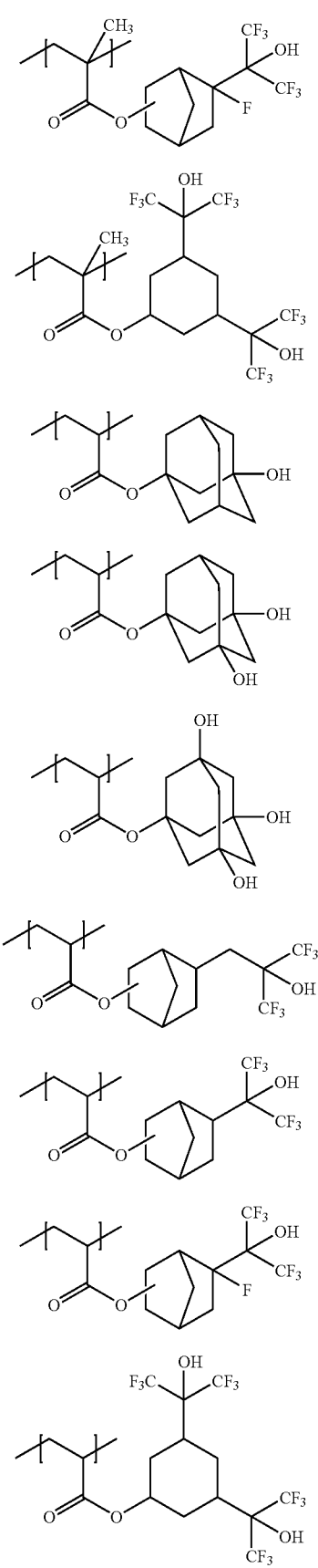
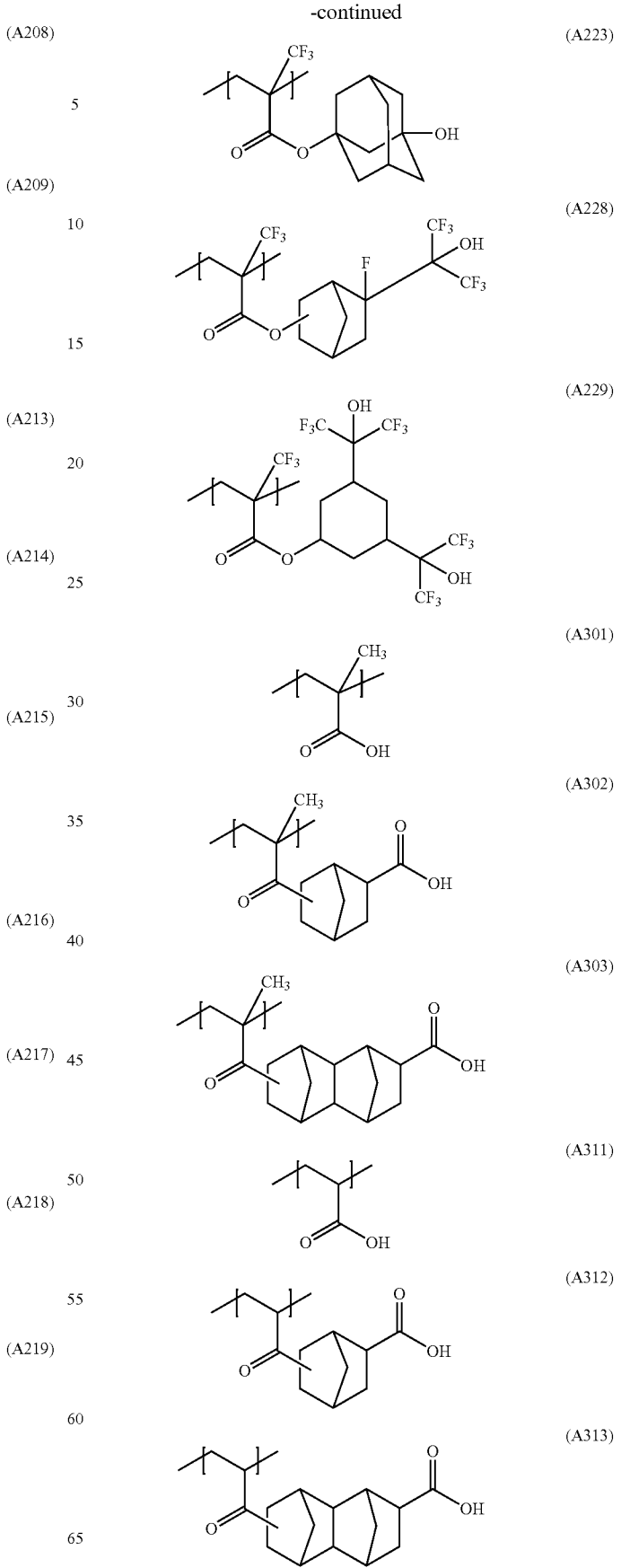

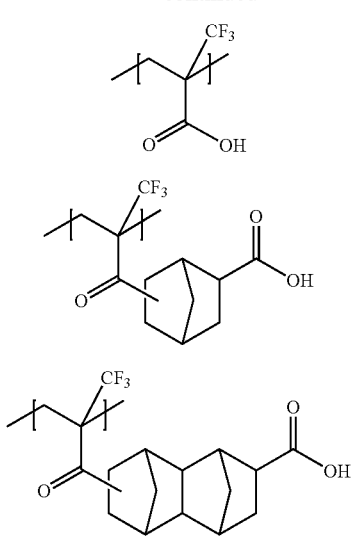

(A321)

(A322)

(A323)

(2) Repeating Unit (B)

Repeating unit (B), having a structure in which a hydroxyl group is protected by an acid-dissociable dissolution-inhibitive group, modifies the solubility of the copolymer in an alkaline developer. Examples of preferred structures include those in which a hydroxyl group represented by formula (A1) to (A3) is protected by an acid-dissociable dissolution-inhibitive group represented by formula (b1) or (b2).

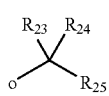

(b1)

In formula (b1), o represents a binding site of formula (b1). Each of $R_{23}$ and $R_{24}$ independently represents a C1-C4 hydrocarbon group, specifically, a C1-C4 alkyl group such as methyl, ethyl, n-propyl, i-propyl, n-butyl, or i-butyl. $R_{25}$ represents a C1-C12 hydrocarbon group, specifically, a C1-C12 linear, branched, or cyclic alkyl group such as methyl, ethyl, n-propyl, i-propyl, n-butyl, i-butyl, cyclopentyl, cyclohexyl, norbornyl, tricyclo[5.2.1.0$^{2,6}$]decanyl, adamantyl, or tetracyclo[4.4.0.1$^{2,5}$.1$^{7,10}$]dodecanyl. $R_{25}$ may be linked to $R_{23}$ or $R_{24}$ to form a ring, specifically, a C5-C12 saturated alicyclic ring such as a cyclopentane ring, a cyclohexane ring, a norbornane ring, a tricyclo[5.2.1.0$^{2,6}$]decane ring, an adamantane ring, or a tetracyclo[4.4.0.1$^{2,5}$.1$^{7,10}$]dodecane ring.

Particularly preferred is a case in which $R_{25}$ (or $R_{25}$ linked to $R_{23}$ or $R_{24}$) includes a ring, specifically, a ring such as a cyclopentane ring, a cyclohexane ring, a norbornane ring, a tricyclo[5.2.1.0$^{2,6}$]decane ring, an adamantane ring, or a tetracyclo[4.4.0.1$^{2,5}$.1$^{7,10}$]dodecane ring, since a large difference in solubility in an alkaline developer is provided before and after lithography, which is preferred for making fine patterns.

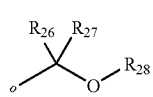

(b2)

In formula (b2), o represents a binding site of formula (b2). Each of $R_{26}$ and $R_{27}$ independently represents a hydrogen atom or a C1-C4 hydrocarbon group, specifically, a hydrogen atom or a C1-C4 alkyl group such as methyl, ethyl, n-propyl, i-propyl, n-butyl, or i-butyl. $R_{28}$ represents a C1-C12 hydrocarbon group, specifically, a C1-C12 linear, branched, or cyclic alkyl group such as methyl, ethyl, n-propyl, i-propyl, n-butyl, i-butyl, t-butyl, 2-ethylhexyl, cyclopentyl, cyclohexyl, norbornyl, tricyclo[5.2.1.0$^{2,6}$]decanyl, adamantyl, or tetracyclo[4.4.0.1$^{2,5}$.1$^{7,10}$]dodecanyl. $R_{26}$ may be linked to $R_{27}$ or $R_{28}$ to form a ring. Specific examples of rings formed from $R_{26}$ and $R_{27}$ include a cyclopentane ring, a cyclohexane ring, a norbornane ring, a tricyclo[5.2.1.0$^{2,6}$]decane ring, an adamantane ring, and a tetracyclo[4.4.0.1$^{2,5}$.1$^{7,10}$]dodecane ring. Specific examples of a ring formed from $R_{26}$ and $R_{28}$ include a hydrofuran ring and a hydropyran ring.

Specific examples of repeating unit (B) will next be described. However, the present invention is not limited to those examples. Among specific repeating units (B), one single or a plurality of different members may be selected.

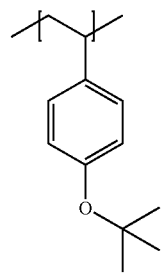

(B111)

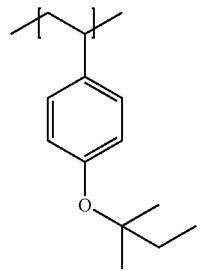

(B112)

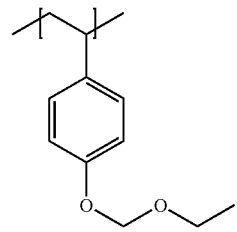

(B121)

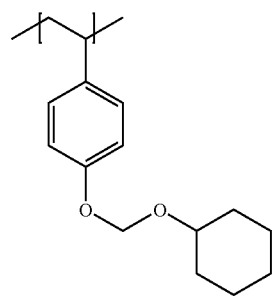

(B122)

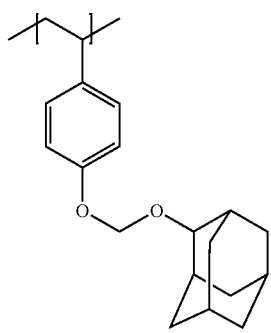
(B123)
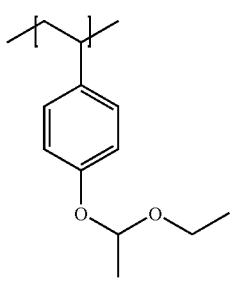
(B124)
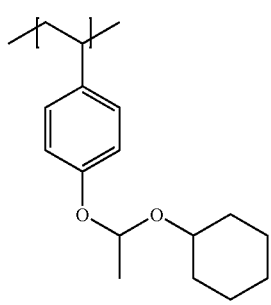
(B125)
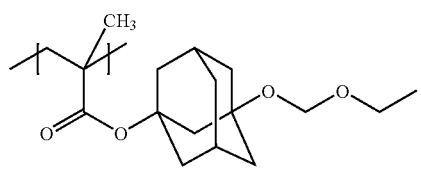
(B221)
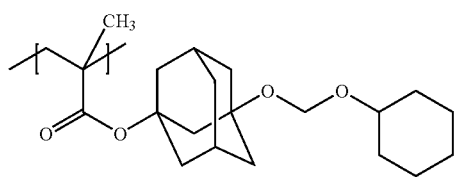
(B222)
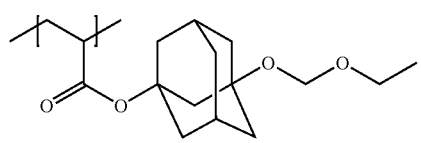
(B223)
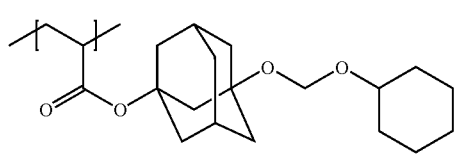
(B224)
(B225)
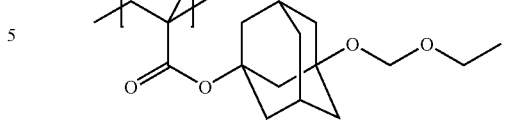
(B226)
(B3101)
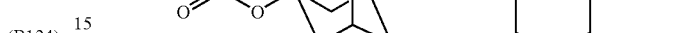
(B3102)
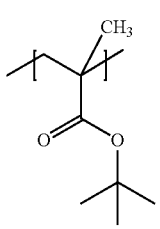
(B3103)
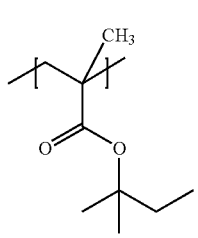
(B3104)
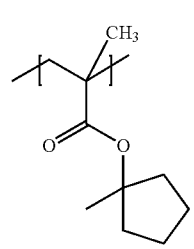
(B3105)

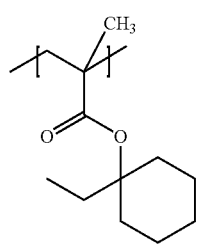 (B3106)
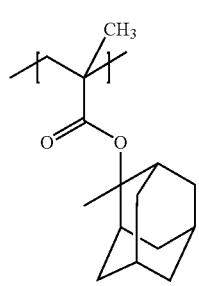 (B3107)
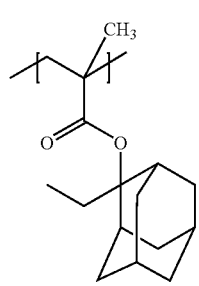 (B3108)
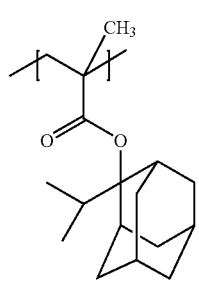 (B3109)
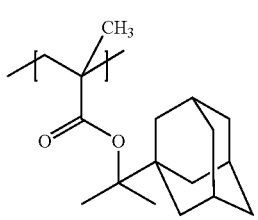 (B3110)
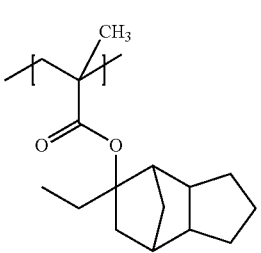 (B3111)
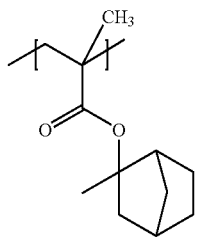 (B3112)
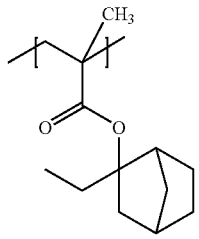 (B3113)
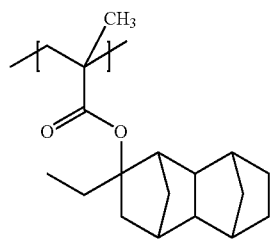 (B3114)
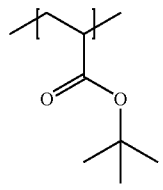 (B3121)
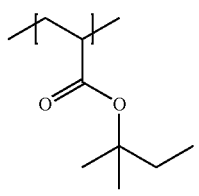 (B3122)
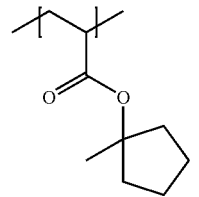 (B3123)
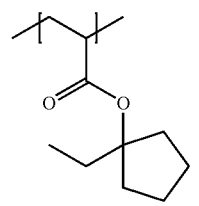 (B3124)

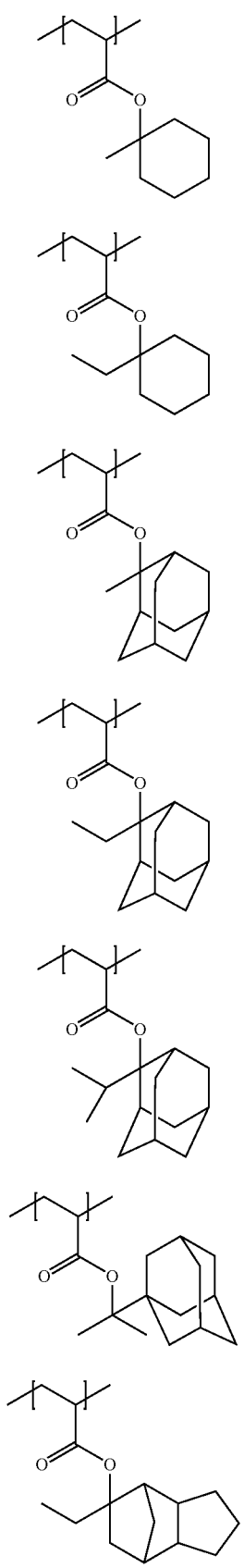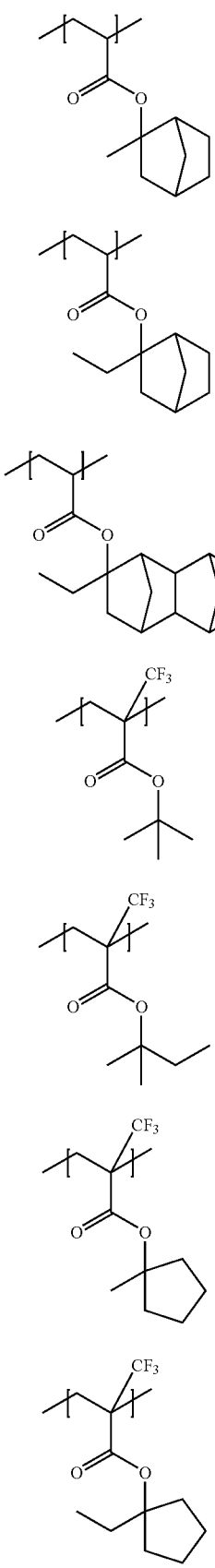

(B3145) 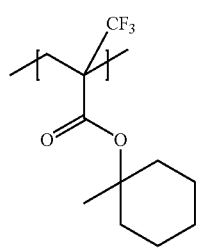
(B3146) 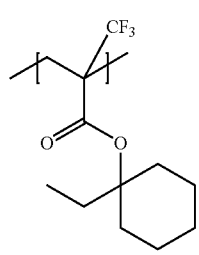
(B3147) 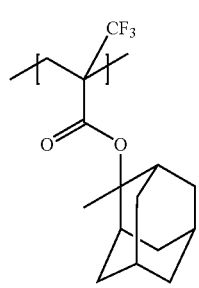
(B3148) 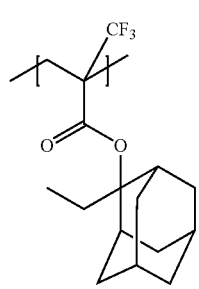
(B3149) 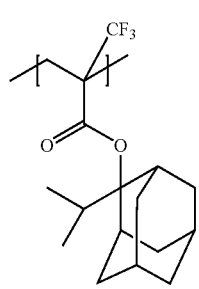
(B3150) 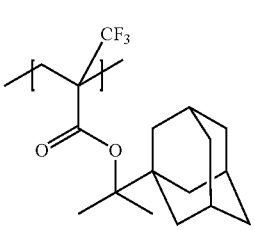
(B3151) 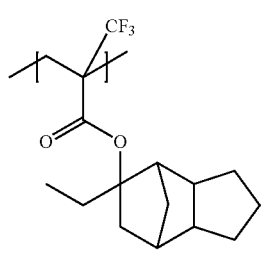
(B3152) 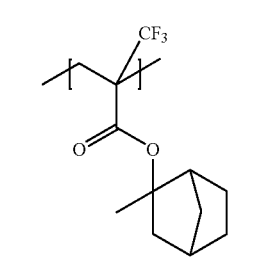
(B3153) 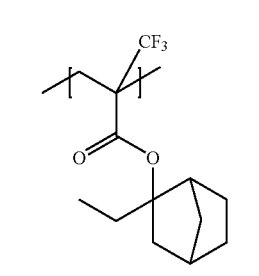
(B3154) 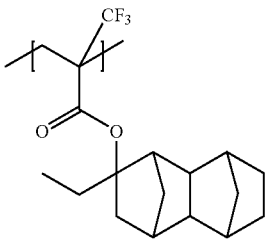
(B3161) 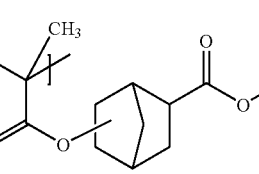
(B3162) 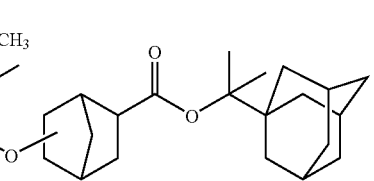
(B3163) 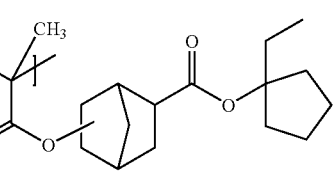

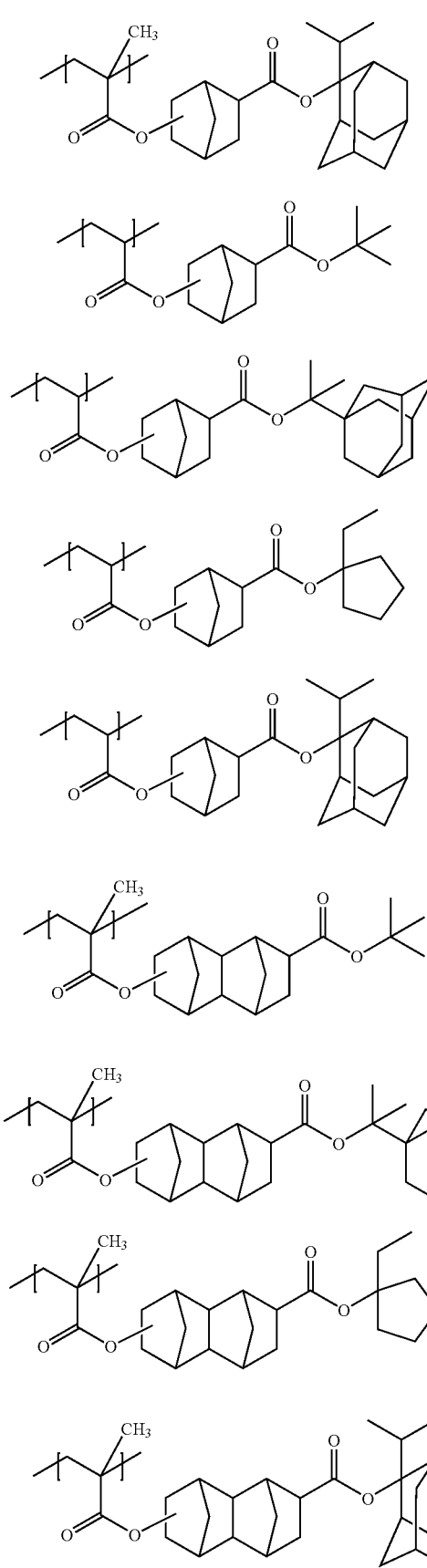
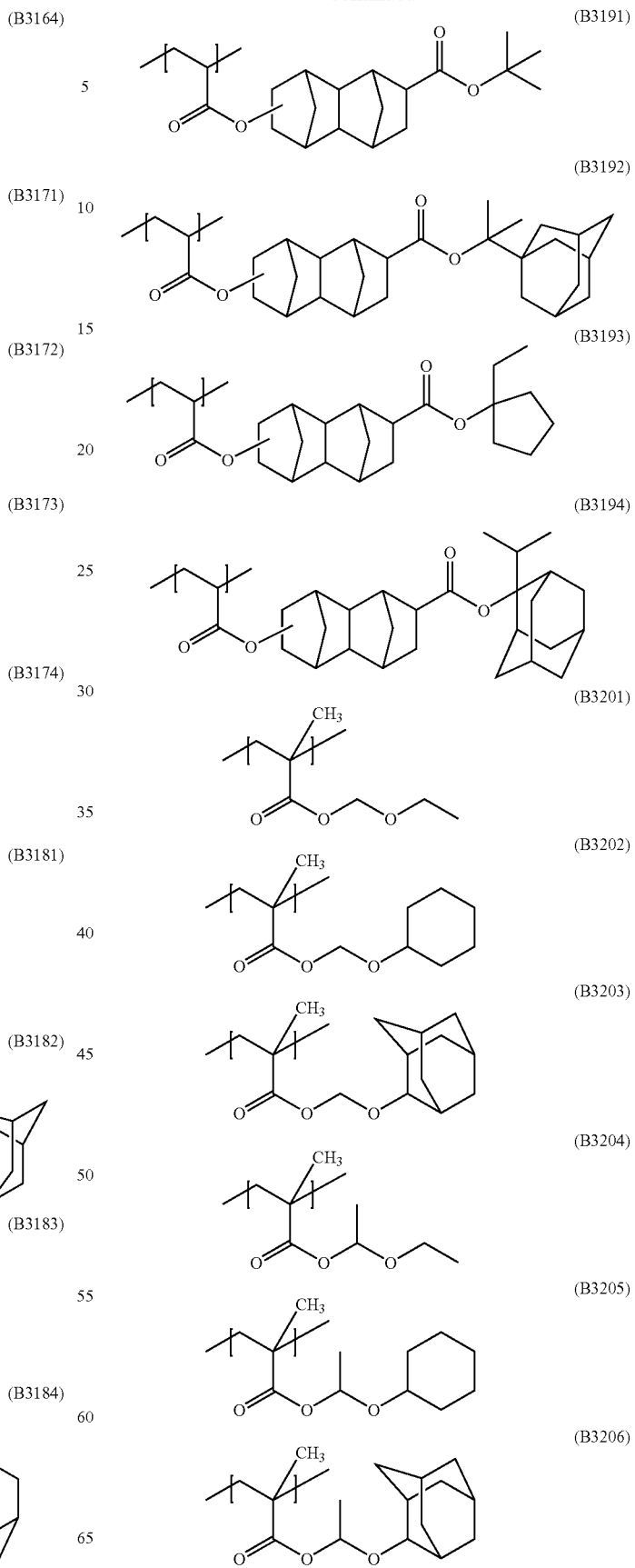

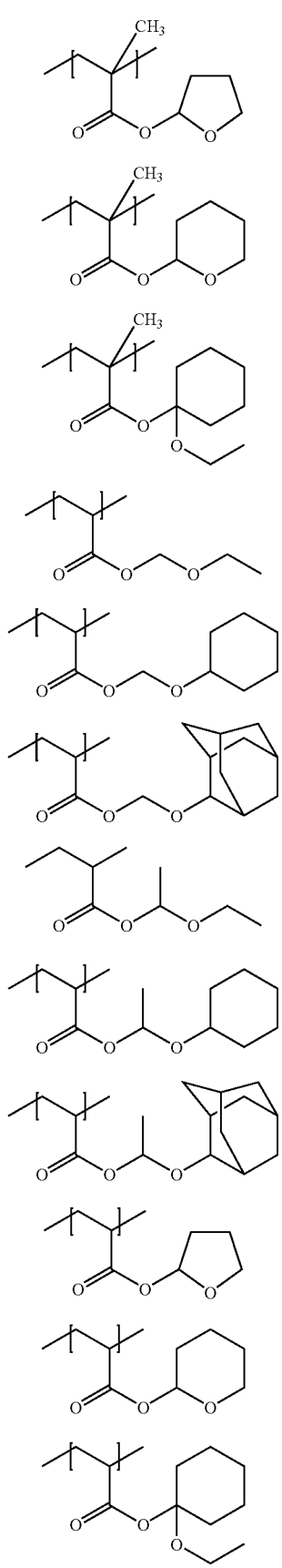
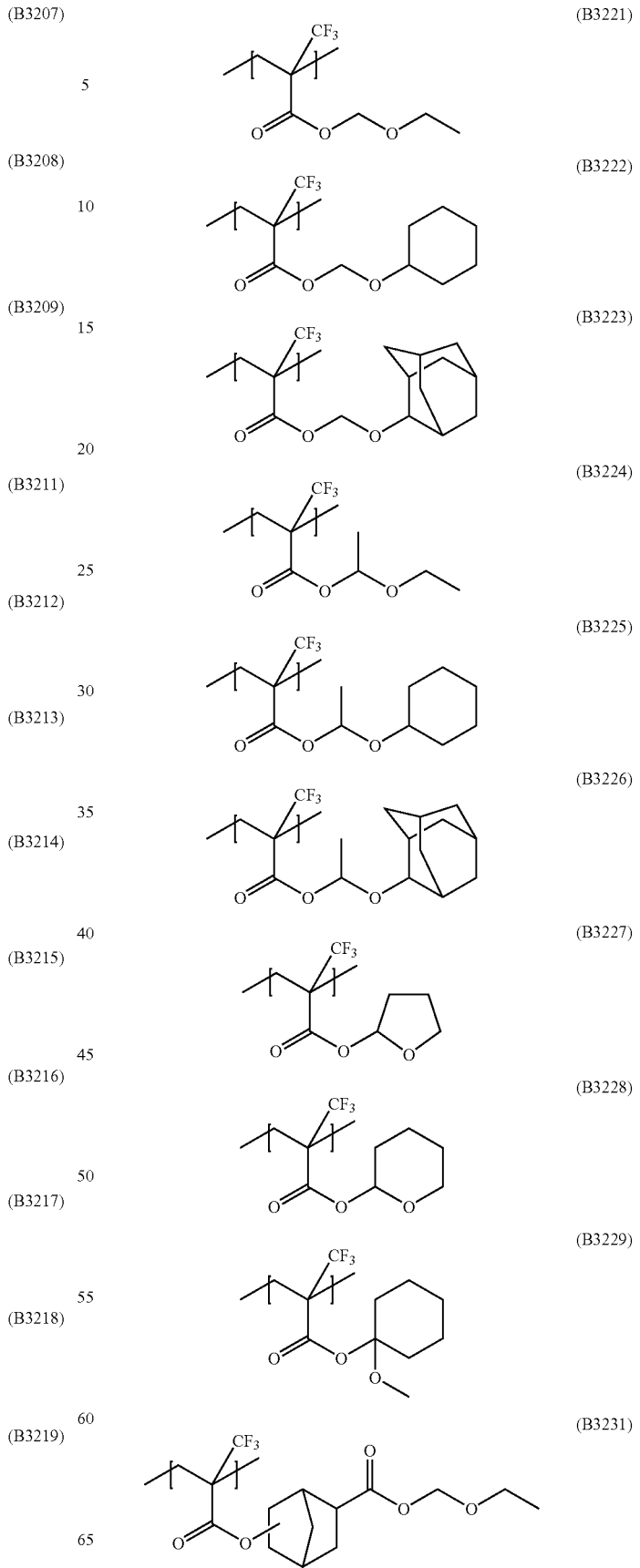

(B3232) 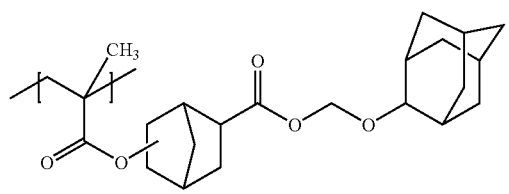
(B3233) 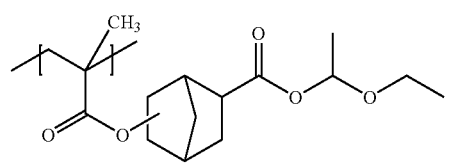
(B3234) 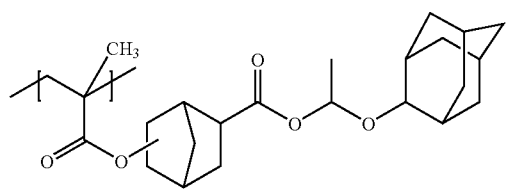
(B3241) 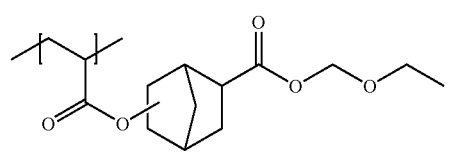
(B3242) 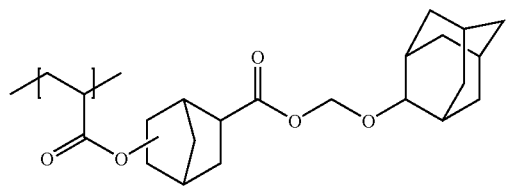
(B3243) 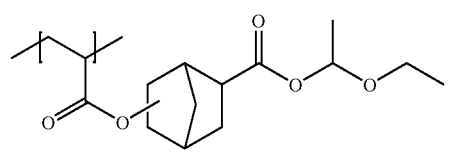
(B3244) 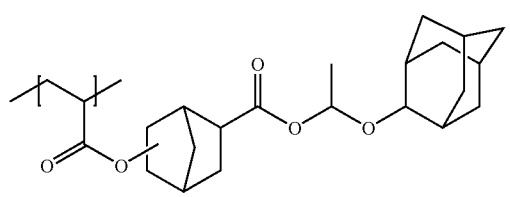
(B2151) 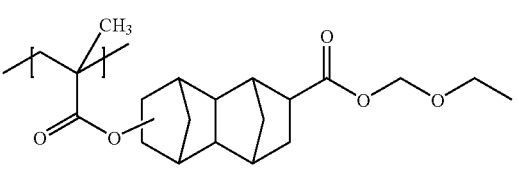
(B3252) 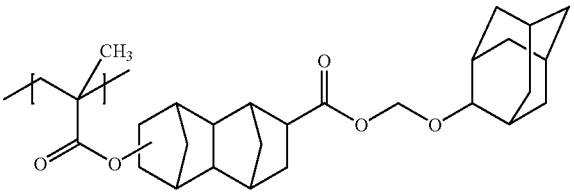
(B3253) 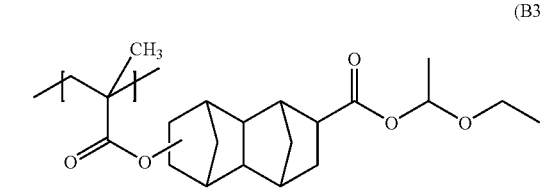
(B3254) 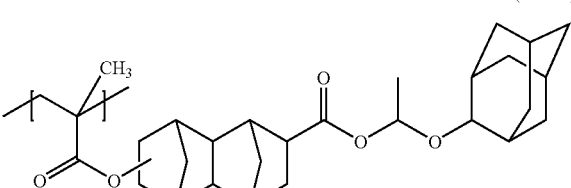
(B3261) 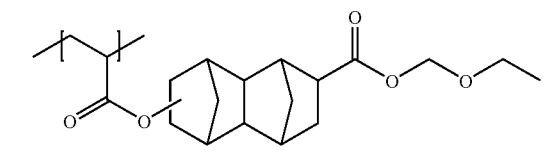
(B3262) 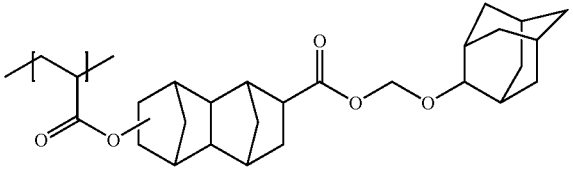
(B263) 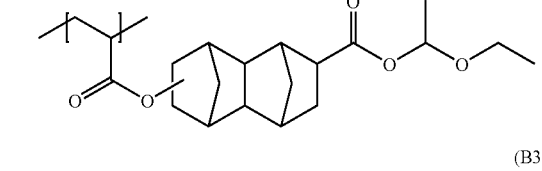
(B3264) 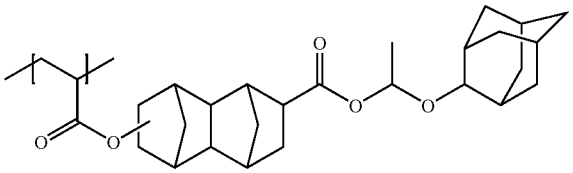
(3) Repeating Unit (C)
Repeating unit (C), having a lactone structure, enhances adhesion of the copolymer to a substrate or a underlying film, and controls the solubility of the copolymer in a solvent for lithography or an alkaline developer. Examples of preferred repeating units (C) include structures represented by formula (C1).

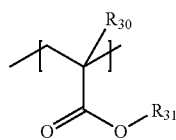

(C1)

In formula (C1), $R_{30}$ represents a hydrogen atom or a C1-C4 hydrocarbon group which may be substituted by a fluorine atom; specifically, a hydrogen atom or a C1-C4 alkyl group, such as methyl, ethyl, n-propyl, i-propyl, n-butyl, i-butyl, or trifluoromethyl. $R_{30}$ is preferably a hydrogen atom, a methyl group, or a trifluoromethyl group. $R_{31}$ represents a lactone-structure-including group represented by formula (C).

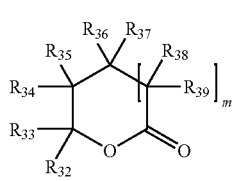

(c)

In formula (c), any one of $R_{32}$ to $R_{39}$ represents a single bond having a binding site of $R_{31}$, and the remaining ones of to $R_{39}$ each represent a hydrogen atom or a C1-C4 hydrocarbon or alkoxy group. Alternatively, any one of $R_{32}$ to represents a C3-C12 hydrocarbon group which may include an oxygen atom or a sulfur atom, the hydrocarbon group having a binding site of $R_{31}$ and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the aforementioned C5-C15 alicyclic ring; and the further remaining ones of $R_{32}$ to $R_{39}$ each represent a hydrogen atom or a C1-C4 hydrocarbon or alkoxy group.

Specific examples of the alicyclic ring include a cyclopentane ring, a cyclohexane ring, a norbornane ring, a 7-oxa-norbornane ring, a 7-thia-norbornane ring, and a tetracyclo[4.4.0.1$^{2,5}$.1$^{7,10}$]dodecane ring. Of these, a norbornane ring and a 7-oxa-norbornane ring are preferred. Specific examples of the C1-C4 hydrocarbon group include methyl, ethyl, n-propyl, i-propyl, n-butyl, and i-butyl. Specific examples of the C1-C4 alkoxy group include methoxy and ethoxy.

The "m" is an integer of 0 or 1.

Examples of particularly preferred lactone structures in which any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group, include γ-butyrolactone structures and δ-valerolactone structures. Examples of particularly preferred lactone structures in which any one of $R_{32}$ to $R_{39}$ represents a C3-C14 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the aforementioned C5-C15 alicyclic ring; and the further remaining ones of $R_{32}$ to $R_{39}$ each represent a hydrogen atom or a C1-C4 hydrocarbon or alkoxy group, include 1,3-cyclohexanecarbolactone structures, 2,6-norbornanecarbolactone structures, 7-oxa-2,6-norbornanecarbolactone structures, and a 4-oxa-tricyclo[5.2.1.0$^{2,6}$]decane-3-one structure.

Specific examples of repeating unit (C) will next be described. However, the present invention is not limited to those examples. Among specific repeating units (C), one single or a plurality of different members may be selected.

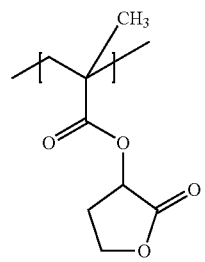

(C101)

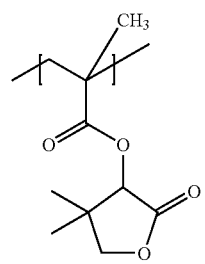

(C102)

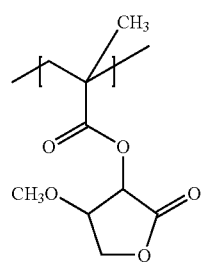

(C103)

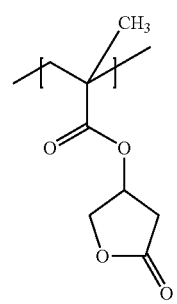

(C104)

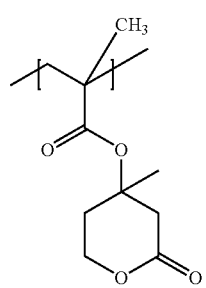

(C105)

-continued

-continued (C132) (C133) (C135) (C136) (C137) (C141) (C142) (C145) (C146)

(C151) (C152) (C153) (C154) (C155)

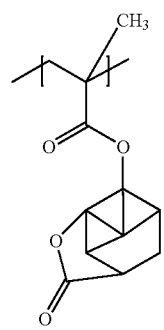
(C156)
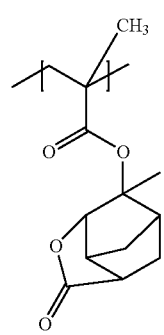
(C157)
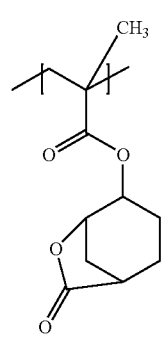
(C158)
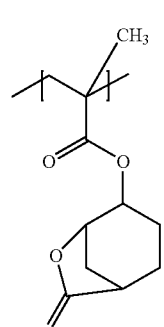
(C158)
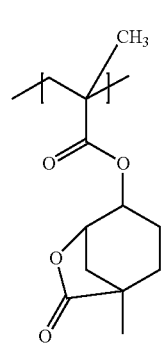
(C159)
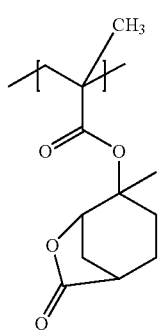
(C160)
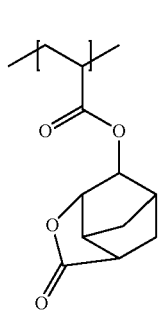
(C171)
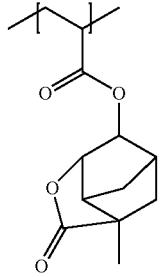
(C172)
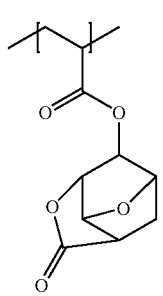
(C173)
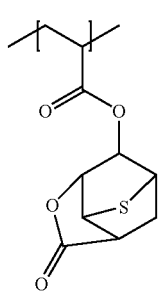
(C174)

(C175) 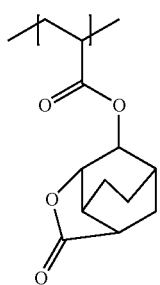

(C176) 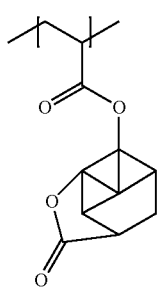

(C177) 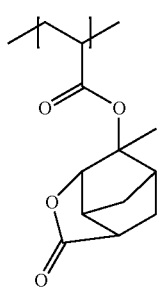

(C178) 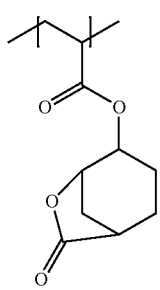

(C179) 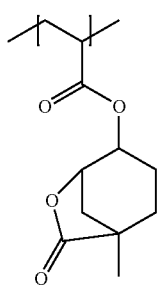

(C180) 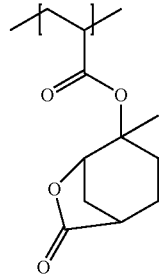

(4) Repeating Unit (D)

Repeating unit (D), having a cyclic ether structure, enhances adhesion of the copolymer to a substrate or an underlying film, controls the solubility of the copolymer in a solvent for lithography or an alkaline developer, and reacts with a curing agent to form a cross-linking structure. Preferred examples of repeating unit (D) include structures represented by formula (D1).

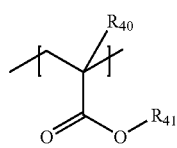
(D1)

In formula (D1), $R_{40}$ represents a hydrogen atom or a C1-C4 hydrocarbon group which may be substituted by a fluorine atom; specifically, a hydrogen atom or a C1-C4 alkyl group, such as methyl, ethyl, n-propyl, i-propyl, n-butyl, i-butyl, or trifluoromethyl, with a hydrogen atom, methyl, and trifluoromethyl being preferred. $R_{41}$ represents a C3-C7 hydrocarbon group having a 3- to 6-membered cyclic ether structure. Specific examples of the cyclic ether structure of the hydrocarbon group include an epoxy ring, an oxetane ring, a tetrahydrofuran ring, and a tetrahydropyran ring. Specific examples of such hydrocarbon groups include a glycidyl group, an oxetanylmethyl group, a tetrahydrofuranylmethyl group and a tetrahydropyranylmethyl group. Among them, a glycidyl group is particularly preferred.

Specific examples of repeating unit (D) will next be described. However, the present invention is not limited to those examples. Among specific repeating units (D), one single or a plurality of different members may be selected.

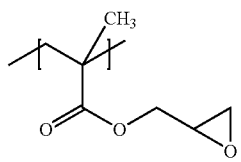
(D101)

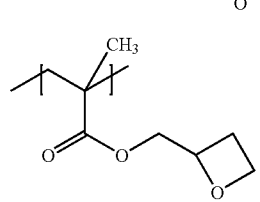
(D102)

-continued

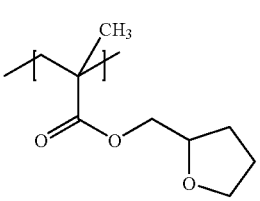 (D103)

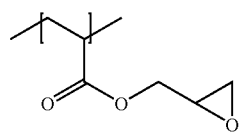 (D111)

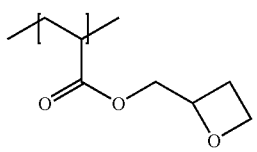 (D112)

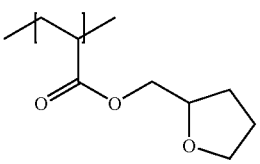 (D113)

(5) Repeating Unit (E)

Repeating unit (E), having an acid-stable dissolution-inhibitive moiety, controls the solubility of the copolymer in a solvent for lithography or an alkaline developer, optical properties (e.g., refractive index and light transmittance) of the thin film of the copolymer, etc. Examples of preferred repeating units (E) include the following structures (E1), (E2), and (E3), in which a hydrogen atom of a hydroxyl group represented by formula (A1), (A2), or (A3) has been substituted by an acid-stable dissolution-inhibitive group.

Examples of the acid-stable dissolution-inhibitive group in the structures (E1) to (E3) include primary to tertiary carbon C1-C12 hydrocarbon groups which is linked to an oxygen atom of the hydroxyl group through hydrogen atom substitution, and a structure having a 1-adamantyl group. Specific examples include C1-C12 linear, branched, or cyclic alkyl groups such as methyl, ethyl, n-propyl, i-propyl, n-butyl, i-butyl, cyclopentyl, cyclohexyl, 2-norbornyl, 2-isobornyl, 8-tricyclo[5.2.1.0$^{2,6}$]decanyl, 1-adamantyl, 2-adamantyl, and 4-tetracyclo[4.4.0.1$^{2,5}$.1$^{7,10}$]dodecanyl.

Another preferred example of the structure is structure (E4) represented by formula (E4).

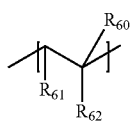 (E4)

In formula (E4), $R_{60}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl, with a hydrogen atom, methyl, and trifluoromethyl being preferred. $R_{61}$ represents a hydrogen atom, a single bond which binds to $R_{62}$, or a C1 to C4 hydrocarbon group.

Specific examples include a hydrogen atom, a single bond, methylene, ethylene, and isopropylene. $R_{62}$ represents a C6 to C14 aromatic hydrocarbon group. Specific examples include a benzene ring, a naphthalene ring, and an anthracene ring.

Specific examples of repeating unit (E) will next be described. However, the present invention is not limited to those examples. Among specific repeating units (E), one single or a plurality of different members may be selected.

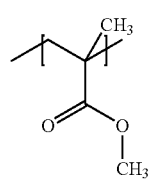 (E101)

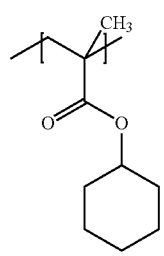 (E102)

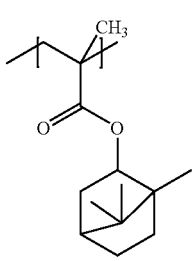 (E103)

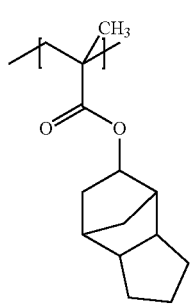 (E104)

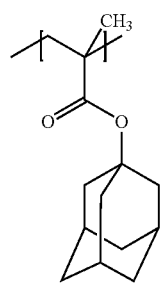 (E105)

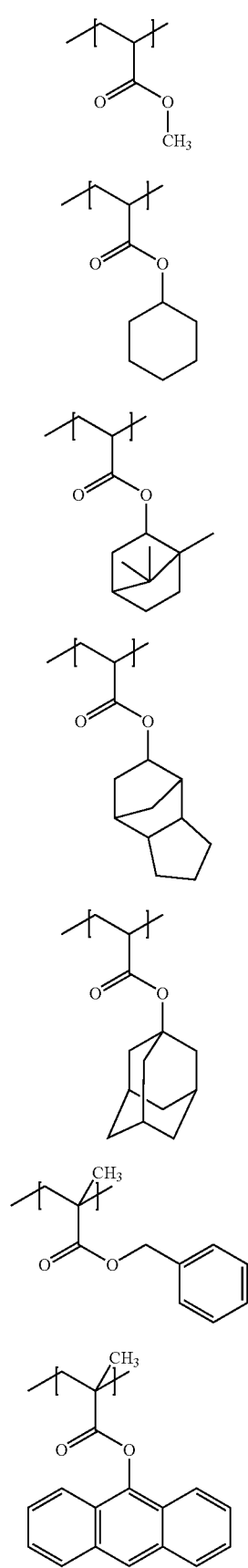
(E111)
(E112)
(E113)
(E114)
(E115)
(E121)
(E122)
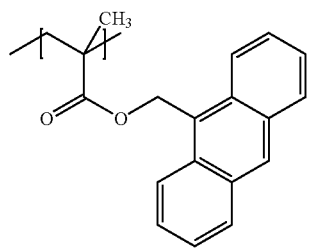
(E123)
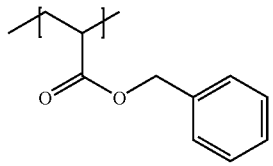
(E131)
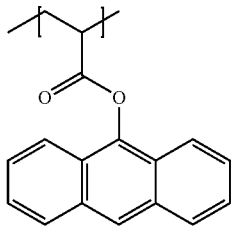
(E132)
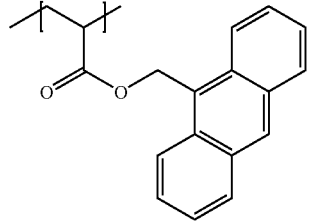
(E133)
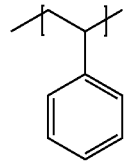
(E201)
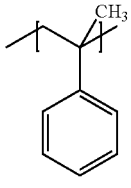
(E202)
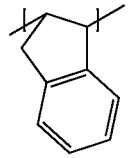
(E203)
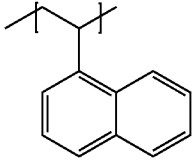
(E204)

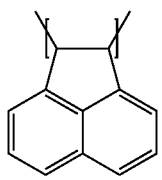
(E205)

(6) Composition of Repeating Units

The repeating unit composition varies depending on the purpose of use of the thin film employed in semiconductor lithography. Examples of ranges of repeating unit composition will next be described suitable for each of the employed thin films.

When the copolymer is employed for forming a chemical amplification-type positive resist film, repeating unit (A) and repeating unit (C) are employed in a total amount of 20 to 95 mol %, preferably 30 to 90 mol %, more preferably 40 to 85 mol %; repeating unit (B) is employed in an amount of 5 to 80 mol %, preferably 10 to 70 mol %, more preferably 15 to 60 mol %; and repeating unit (E) is employed in an amount of 0 to 50 mol %, preferably 0 to 40 mol %, more preferably 0 to 30 mol %.

When the copolymer is employed for forming a negative resist film, repeating unit (A) and repeating unit (D) are employed in a total amount of 50 to 100 mol %, preferably 60 to 100 mol %, more preferably 70 to 100 mol %; repeating unit (C) is employed in an amount of 0 to 50 mol %, preferably 0 to 40 mol %, more preferably 0 to 30 mol %; and repeating unit (E) is employed in an amount of 0 to 50 mol %, preferably 0 to 40 mol %, more preferably 0 to 30 mol %.

When the copolymer is employed for forming an anti-reflection film or a top coating film for immersion lithograpy, repeating unit (A) and repeating unit (D) are employed in a total amount of 5 to 80 mol %, preferably 10 to 70 mol %, more preferably 15 to 60 mol %; repeating unit (B) is employed in an amount of 0 to 50 mol %, preferably 0 to 40 mol %, more preferably 0 to 30 mol %; repeating unit (C) is employed in an amount of 0 to 50 mol %, preferably 0 to 40 mol %, more preferably 0 to 30 mol %; and repeating unit (E) is employed in an amount of 0 to 95 mol %, preferably 10 to 90 mol %, more preferably 20 to 85 mol %.

(7) End Structure

The copolymer of the present invention has an already known end structure. Generally, the copolymer has, at a polymerization initiation end thereof, a radical structure generated from a radical polymerization initiator. When a chain-transfer agent is employed, the copolymer has, at a polymerization initiation end thereof, a radical structure generated from the chain-transfer agent. When chain transfer occurs in, for example, a solvent or a monomer, the copolymer has, at a polymerization initiation end thereof, a radical structure generated from the solvent or monomer. When recombination is stopped through termination reaction, the copolymer may have, at both ends thereof, polymerization initiation ends, whereas when disproportionation termination occurs, the copolymer may have, at one end thereof, a polymerization initiation end, and, at the other end, an end structure derived from a monomer employed. When a polymerization terminator is employed, the copolymer may have, at one end thereof, a polymerization initiation end, and, at the other end, an end structure derived from the polymerization terminator. A plurality of these initiation and termination reactions may occur in a single polymerization reaction system. In such a case, the copolymer is in the form of a copolymer mixture having a plurality of end structures. The polymerization initiator, chain-transfer agent, and solvent which may be employed in the present invention will be described hereinbelow.

(8) Molecular Weight and Polydispersibility Index

When the copolymer has an excessively high weight average molecular weight (hereinafter may be referred to as Mw), the copolymer exhibits poor solubility in a resist solvent or an alkaline developer, whereas when the copolymer has an excessively low Mw, the coating performance of the copolymer serving as a resist is impaired. Therefore, the weight average molecular weight (Mw) preferably falls within a range of 1,000 to 50,000, more preferably 1,500 to 30,000, particularly preferably 2,000 to 20,000. The molecular weight distribution (Mw/Mn) preferably falls within a range of 1.0 to 5.0, more preferably 1.0 to 3.0, particularly preferably 1.2 to 2.5.

2. Refining and Filtration Rate

In the present invention, the refining and filtration rate is defined as follows. Specifically, a copolymer is dissolved in a specific solvent for lithography, to thereby prepare a copolymer solution having a predetermined viscosity. When the solution is caused to pass through a microporous filter having a predetermined pore size, at a predetermined pressure difference and for a predetermined period of time, the average flow rate per unit filter area is defined as the refining and filtration rate.

The average flow rate is calculated by dividing the amount of solution having passed through the filter over a predetermined period of time by the predetermined period of time. The thus-obtained flow rate is further divided by the effective filtration area of the filter, to thereby obtain an average flow rate per unit filter area. More specifically, a copolymer is dissolved in PGMEA (a typical lithography solvent), to thereby prepare a solution having a viscosity of 15 mPa·sec, and the solution is caused to pass through a filter having a pore size of 0.03 μm under a pressure difference of 0.1 MPa and for 60 minutes. The amount (g) of solution which has passed through the filter over 60 (min) is divided by the effective filtration area ($m^2$) of the filter.

The copolymer of the present invention exhibits a refining and filtration rate (i.e., the above-defined average flow rate per unit filter area) of 200 g/min/$m^2$ or more, preferably 250 g/min/$m^2$ or more, particularly preferably 300 g/min/$m^2$ or more. A copolymer exhibiting a refining and filtration rate less than 200 g/min/$m^2$ generates microparticles (e.g., microgel) when formed into a thin film. Such microparticles impair the appearance of thin film, further resulting in generation of pattern defects, which is not preferred.

When a copolymer contains no micro-foreign matter such as gel, which causes pattern defects and which is not completely dissolved in a solvent, a solution of the copolymer can pass through a filter at a specific flow rate. However, when the copolymer contains such micro-foreign matter, micropores of the filter are gradually plugged as the solution flows through the filter, reducing the flow rate. The copolymer of the present invention contains such foreign matter in a considerably reduced amount, to thereby exhibit an average flow rate equal to or greater than a specific value. Since foreign matter such as gel can freely deform, the foreign matter cannot be completely removed, even after refining and filtration; i.e., production step (U) as described below, is performed. Thus, the copolymer of the invention needs to be produced under the specific conditions as described in the below-mentioned production step (P).

The copolymer concentration in a PGMEA solution which is subjected to the measurement varies depending on the type of copolymer, since the viscosity of the solution of the relevant copolymer is adjusted to 15 mPa·sec at the measurement temperature. The measurement temperature is preferably room temperature to a maximum possible extent, in order to control the solubility of microgel in PGMEA. The measurement temperature is generally 10 to 40° C., preferably 20 to 30° C., particularly preferably 22 to 27° C.

The filter employed in the measurement is preferably a membrane filter made of a material such as polyethylene, polypropylene, or fluorinated polyethylene, since the effect on flow rate of a copolymer depending on the polarity of the copolymer is minimized. Among them, a filter made of polyethylene is preferred, since variation in micropore size is small, and high solvent resistance is ensured. Specific examples of preferred filters include a membrane filter made of ultra-high-molecular weight polyethylene employed in a filtration device such as Microgard Plus HC10 (product of Nihon Entegris K.K.).

3. Production Steps

The copolymer of the present invention can be produced through a step (P); polymerizing monomers for forming the aforementioned structure in the presence of a polymerization initiator in an organic solvent. If necessary, the step (P) may be carried out in combination with, for example, a step (Q) of converting a polar group of the copolymer to another polar group (i.e., protecting or deprotecting a polar group of the copolymer); a step (R) of removing, from the copolymer, unwanted substances such as unreacted substances (e.g., monomers or a polymerization initiator) or low-molecular-weight components (e.g., oligomers); a step (S) of removing low-boiling-point impurities or replacing the original solvent with a solvent suitable for a subsequent step or lithography; a step (T) of reducing the amount of metal impurities which are undesirable for fabrication of a semiconductor; or a step (U) of reducing the amount of substances (e.g., microgel) which may cause pattern defects.

(1) Step (P)

In step (P), monomers are polymerized in the presence of a polymerization initiator in an organic solvent. In the present invention, a polymerization tank equipped with at least a jacket for supplying a heating medium, an agitator, and a condenser is employed as an apparatus which realizes industrial-scale production. The capacity of the polymerization tank is 30 L or more, preferably 100 L or more, particularly preferably 200 L or more. The polymerization tank is preferably a container made of a metallic material with a glass lining, since metallic contamination must be prevented, and high thermal conductivity and safety are attained. The agitation impeller is preferably a triple retreated blade impeller, a partial impeller such as a twin-star impeller (product of Kobelco Eco-Solutions Co., Ltd.), a full-zone impeller (product of Kobelco Eco-Solutions Co., Ltd.), and a full impeller such as a bend-leaf impeller (product of Hakko Sangyo Co., Ltd.). From the viewpoint of agitation efficiency, full impellers such as a full-zone impeller and a bend-leaf impeller are particularly preferred.

In the present invention, polymerization is preferably performed through a dropwise addition technique in which monomers and a polymerization initiator are added dropwise to a heated solvent. A portion of the monomers may be added in advance to a heated solvent. Alternatively, a plurality of liquids having different monomer compositions, polymerization initiator concentrations, or chain-transfer agent concentrations are added dropwise to a solvent, whereby parameters such as the monomer composition and the compositional proportions of monomers, a polymerization initiator, and a chain-transfer agent may be modified during the course of addition.

Among the dropwise addition techniques, there may be employed a technique (P1) in which monomers and a polymerization initiator are dissolved together in a solvent optionally, and the resultant solution is added dropwise to a heated solvent for polymerization of the monomers (i.e., mixing-dropwise addition technique); and a technique (P2) in which monomers and a polymerization initiator are separately dissolved in different solvents optionally, and the resultant solutions are separately added dropwise to a heated solvent for polymerization of the monomers (separate dropwise addition technique). When the mixing-dropwise addition technique (P1) is employed, high-concentration unreacted monomers are likely to come into contact with low-concentration radicals in a reservoir for the monomer solution which is to be added dropwise to a polymerization system, and thus a high polymer, which is one cause for forming microgel, tends to be generated. In contrast, in the separate dropwise addition technique (P2), the monomer solution is not co-present with a polymerization initiator in a reservoir for the monomer solution, and a high polymer cannot be formed. Therefore, the separate dropwise addition technique (P2) is particularly preferred.

In the separate dropwise addition technique (P2), the monomer solution and the initiator solution may be preliminarily mixed together just before the polymerization tank. However, particularly preferably, the two solutions are added dropwise to a heated solvent from individual reservoirs, since the mixture may generate a high polymer before starting of addition. The feed rate of the monomer solution and that of the initiator solution may be individually predetermined so that a copolymer having a desired molecular weight distribution can be produced. Through modifying either one or both of the two liquid feed rates, copolymers having a wide range of molecular weight distribution profile (a sharp distribution profile to a distribution with polydispersibility) can be produced with high reproducibility. In the case where the feed of the initiator solution is reduced in an initial stage of reaction and increased in a final stage of reaction, a copolymer having relatively high molecular weight is formed in the initial reaction stage in which the radical concentration is low, whereby the formed copolymer has polydispersibility in the molecular weight distribution profile. Alternatively, each feed rate may be varied non-stepwise or stepwise.

In the dropwise addition technique, the amount of polymerization solvent initially fed to a reaction tank (hereinafter may be referred to as "initially fed solvent") may be at least a minimum amount which allows the polymerization system to be stirred. An excessively large amount of the solvent is not preferred, since the amount of monomer solution which can fed to the reaction tank is reduced, thereby lowering production efficiency. Generally, the relative volume of polymerization solvent is 1/30 or more, with respect to the amount of the reaction system (at the end of feeding, i.e.; the total amount of initially fed solvent, added monomer solution, and added initiator solution), preferably 1/20 to 1/2, particularly preferably 1/10 to 1/3. A portion of the monomer solution may be added to the initially fed solvent.

During dropwise addition, the monomer concentration and the polymerization initiator concentration are preferably higher, from the viewpoint of productivity. Particularly when the polymerizable monomer(s) or the polymerization initiator is in the liquid form, the monomer(s) or initiator can be fed without dissolving in solvent. However, when the polymerizable monomer(s) or the polymerization initiator is in the form of viscous liquid or solid, the monomer(s) or initiator must be dissolved in solvent before addition. In the case where the monomer(s) or initiator is dissolved in solvent, when the concentration is excessively high, the viscosity of the solution increases, impairing operability. When the polymerizable monomer(s) or the polymerization initiator is solid, dispersion thereof in the polymerization system requires a long period of time, and a high polymer may be readily formed. Therefore, preferably, the monomer concentration or the initiator concentration is controlled so that the monomers and the polymerization initiator can be sufficiently dissolved in solvent, that no deposition occurs during addition, and that the components can readily disperse in the polymerization system, so long as feed operation is not impeded. Specific concentrations, which vary depending on, for example, the combination of the solute(s) and solvent of the solution, are generally adjusted to, for example, a total monomer concentration and a polymerization initiator concentration of 5 to 60 mass %, respectively, preferably 10 to 50 mass %.

The polymerization temperature may be appropriately determined in consideration of, for example, the boiling points of the solvent, monomers, the chain-transfer agent, etc. and the half-life temperature of the polymerization initiator. When the polymerization temperature is low, polymerization is less likely to proceed, which causes problems in terms of productivity, whereas when the polymerization temperature is higher than necessary, problems arise in terms of stability of monomers and a copolymer. Therefore, the polymerization temperature is preferably determined to fall within a range of 40 to 120° C., particularly preferably 60 to 100° C.

In order to attain a target molecular weight of the copolymer and target compositional proportions of units in the copolymer, polymerization temperature must be rigorously controlled. Generally, polymerization reaction is an exothermic reaction, and the polymerization temperature tends to increase as the polymerization reaction proceeds. Thus, the temperature of the polymerization system is difficult to maintain. When polymerization temperature excessively increases, in some cases, polymerization reaction cannot be controlled, and eventually the reaction violently proceeds. Therefore, in the present invention, preferably, at least one compound having a boiling point in the vicinity of a target polymerization temperature is incorporated, as a component of polymerization solvent, into the polymerization system, and the polymerization temperature is adjusted to a temperature equal to or higher than the initial boiling point (at a pressure of polymerization) of the component serving as polymerization solvent. Through employment of this mode, an increase in polymerization temperature can be suppressed by latent heat of volatilization of the polymerization solvent.

The polymerization pressure may be appropriately predetermined. However, the polymerization pressure is preferably near atmospheric pressure; i.e., the polymerization system is open to air, since nitrogen gas (in the case of azo-type initiator) or oxygen gas (in the case of peroxide-type initiator) is generated upon generation of radicals, thereby stabilizing the pressure.

The polymerization system is cooled by the liquids fed thereto, the polymerization solvent which is in reflux, heat radiation to the outside, etc. Therefore, heat must be supplied from the outside to the system. According to the present invention, heat supply is performed by means of a heated medium for heating which is fed to a jacket.

In a mass-production-scale polymerization apparatus, dropwise addition is performed through a long distance. Thus, falling of the liquid drops to the solvent is accelerated. The falling drops reflect at the surface of the solvent, and the splashing drops deposit on the inner wall of the polymerization tank, which serves as a thermal conducting surface. Through evaporation of solvent at the drop-deposited wall surface, monomers are present on the wall at high concentrations. Therefore, in P1, a high polymer is readily formed through polymerization initiated by the initiator incorporated in advance into the drops, and in P2, a high polymer is readily formed through polymerization initiated by a small amount of initiator having migrated into the drops during splashing. In the case where a portion of monomers has been incorporated in advance into a heated solvent, and the remaining portion of the monomers is added dropwise to the solvent, or in the case where a plurality of liquids having different monomer compositions are added dropwise to the solvent, there tends to be formed a copolymer having a repeating unit composition which falls outside the target range, or a copolymer having a continuous segment of specific repeating units. Similar to a high polymer, such copolymers may readily form microgel. When an introduction pipe is extended to a level near the liquid surface in order to prevent deposition of liquid drops on the inner wall of the polymerization tank, monomers are retained in the introduction pipe for a long time and receive excessively heavy heat load. In this case, a high polymer is readily formed.

According to the present invention, the difference in temperature between the heating medium flowing through the jacket of the polymerization tank and the inside of the polymerization tank is controlled to be as small as possible, whereby formation of the aforementioned microgel-forming substances deposited in drops on the inner wall of the polymerization tank can be suppressed. The difference in temperature between the heating medium flowing through the jacket of the polymerization tank and the inside of the polymerization tank must be controlled to be 10° C. or less, more preferably 5° C. or less.

Notably, when a low-temperature monomer solution is added dropwise to a polymerization system, the system is locally cooled, where the monomer concentration is elevated, and the radical concentration is lowered. Under such conditions, a high polymer is possibly formed, which not preferred. Therefore, the monomer solution is preferably preliminarily heated before addition.

Examples of the method of preliminary heating the monomer solution include heating the monomer solution by means of a heat-exchanger or a similar element, in a reservoir or just before feeding to the polymerization system. The preliminary heating temperature is preferably 25° C. or higher, more preferably 30° C. or higher. However, in the case where the monomer solution is preliminarily heated in a reservoir, a heating state is maintained for a long period of time, and a high polymer is possibly formed. Thus, when the monomer solution is preliminarily heated in a reservoir, the preliminary heating temperature is preferably 50° C. or lower, more preferably 40° C. or lower. In some cases, the initiator solution may also be preliminarily heated. However, when the heating temperature is excessively high, the polymerization initiator is decomposed before supply to the solvent. Therefore, the heating temperature is generally 40° C. or lower, preferably 30° C. or lower, more preferably 25° C. or lower.

When the dropwise addition time is short, molecular weight distribution is likely to broaden, and the temperature of a polymerization mixture is lowered due to dropwise addition of a large amount of a solution at one time, which is not preferred. In contrast, when the dropwise addition time is long, the copolymer undergoes thermal history more than necessary, and productivity is reduced, which is not preferred.

Therefore, the dropwise addition time is generally 0.5 to 24 hours, preferably 1 to 12 hours, particularly preferably 2 to 8 hours. No particular limitation is imposed on the order of addition of two liquids. In order to prevent generation of a high polymer, preferably, the two liquids are simultaneously added, or an initiator solution is added prior to addition of the monomer solution. An initiator solution may be added prior to addition of the monomer solution, since a certain period of time is required for generating radicals via decomposition of the polymerization initiator.

Preferably, aging is carried out after completion of dropwise addition by, for example, maintaining the polymerization mixture at the polymerization temperature at a predetermined period of time, or further elevating the temperature of the polymerization mixture to a higher level, so as to allow the remaining unreacted monomers to react. When the aging time is excessively long, productivity per unit time is reduced, and the copolymer undergoes thermal history more than necessary, which is not preferred. Therefore, the aging time is generally 12 hours or shorter, preferably 6 hours or shorter, particularly preferably 1 to 4 hours.

The polymerization initiator employed may be a known radical polymerization initiator and is preferably a radical polymerization initiator such as an azo compound or a peroxide. Specific examples of the azo compound include 2,2'-azobisisobutyronitrile, 2,2'-azobis(2-methylbutyronitrile), dimethyl 2,2'-azobisisobutyrate, 1,1'-azobis(cyclohexane-1-carbonitrile), and 4,4'-azobis(4-cyanovaleric acid). Specific examples of the peroxide include decanoyl peroxide, lauroyl peroxide, benzoyl peroxide, bis(3,5,5-trimethylhexanoyl) peroxide, succinic acid peroxide, tert-butyl peroxy-2-ethylhexanoate, tert-butyl peroxypivalate, and 1,1,3,3-tetramethylbutyl peroxy-2-ethylhexanoate. Of these, azo compounds are particularly preferred, form the viewpoint of safety in handling. These polymerization initiators may be employed singly or in combination. The amount of a polymerization initiator employed may be determined in consideration of target Mw, the types and compositional proportions of monomers (i.e., raw materials), the polymerization initiator, a chain-transfer agent, and a solvent, and production conditions (e.g., polymerization temperature and dropwise addition technique).

Any known chain-transfer agent may optionally be employed. Particularly, a thiol compound is preferably employed, and the thiol compound employed may be selected from among a variety of known thiol compounds. Specific examples include t-dodecyl mercaptan, mercaptoethanol, mercaptoacetic acid, and mercaptopropionic acid. The amount of a chain-transfer agent employed may be determined in consideration of target Mw, the types and compositional proportions of monomers (i.e., raw materials), the polymerization initiator, the chain-transfer agent, and the solvent, and production conditions (e.g., polymerization temperature and dropwise addition technique). The chain-transfer agent may be mixed with monomers or a polymerization initiator, followed by dropwise addition, or may be dissolved in a heated solvent in advance.

No particular limitation is imposed on the polymerization solvent employed, so long as it can dissolve monomers, a polymerization initiator, a chain-transfer agent, and a copolymer produced through polymerization. Specific examples of the solvent include ketones such as acetone, methyl ethyl ketone, methyl isoamyl ketone, methyl amyl ketone, and cyclohexanone; alcohols such as methanol, ethanol, and isopropanol; ether alcohols such as ethylene glycol monomethyl ether, ethylene glycol monoethyl ether, ethylene glycol monobutyl ether, propylene glycol monomethyl ether, and 3-methoxy-3-methyl-1-butanol; ether esters which are compounds obtained through esterification between the aforementioned ether alcohols and acids (e.g., acetic acid); esters such as methyl acetate, ethyl acetate, butyl acetate, methyl propionate, methyl 3-methoxypropionate, ethyl 3-ethoxypropionate, methyl lactate, ethyl lactate, and γ-butyrolactone; ethers such as tetrahydrofuran, 1,4-dioxane, ethylene glycol dimethyl ether, and diethylene glycol dimethyl ether; aromatic hydrocarbons such as toluene and xylene; amides such as N,N-dimethylformamide and N-methylpyrrolidone; dimethyl sulfoxide; and acetonitrile. These solvents may be employed singly or in combination of two or more species.

(2) Step (Q)

Step (Q) is performed at the same timing with or after step (P). In step (Q), a polar group of the copolymer is converted to another polar group through protecting or deprotecting a polar group of the copolymer. Specific examples of the procedure of step (Q) include a step (Q1) in which polar groups (A) or (B) of the copolymer are partially or totally protected with an acid-dissociable dissolution-inhibitive group, to thereby introduce polar groups (C); and a step (Q2) in which polar groups (C) of the copolymer are partially or totally deprotected, to thereby introduce polar groups (A) or (B).

In step (Q1), a copolymer having an alkali-soluble group is dissolved in a solvent, and the copolymer is reacted with an enol ether, a halogenated alkyl ether, or the like in the presence of a catalyst, to thereby introduce an acid-dissociable dissolution-inhibitive group. In step (Q2), a copolymer having an acid-dissociable dissolution-inhibitive group is dissolved in a solvent, and the copolymer is heated in the presence of a catalyst, to thereby dissociate the acid-dissociable dissolution-inhibitive group and introduce an alkali-soluble group.

No particular limitation is imposed on the catalyst employed in steps (Q1) and (Q2), so long as the catalyst attains the aforementioned reactions. The catalyst is preferably a strong acid exhibiting a pKa of 1 or less at 25° C. in water, and specific examples include hydrochloric acid, sulfuric acid, p-toluenesulfonic acid, trifluoroacetic acid, and strong acidic ion exchange resin. Examples of preferred solvent may be the same as those described above as solvents in step (P). However, in step (Q1), use of a solvent having a hydroxyl group (e.g., water or alcohol) is avoided to a maximum possible extent, since such a solvent reacts with enol ether or halogenated alkyl ether.

(3) Step (R)

In the step (R), extraction with a solvent is carried out for removal of unreacted substances (e.g., monomers or a polymerization initiator) or low-molecular-weight components (e.g., oligomers) contained in the copolymer produced through the step (P). The step (R) may be, for example, (R1): a process in which the copolymer is precipitated through addition of a poor solvent, and then separation of the solvent phase is performed; (R1a): a process in which, after completion of the step (R1), a poor solvent is added to wash the copolymer, and then separation of the solvent phase is performed; (R1b): a process in which, after completion of the step (R1), a good solvent is added to redissolve the copolymer, and a poor solvent is added to reprecipitate the copolymer, followed by separation of the solvent phase; (R2): a process in which a poor solvent is added to form two solvent phases (i.e., poor solvent phase and good solvent phase), and separation of the poor solvent phase is performed; or (R2a): a process in which, after completion of the step (R2), a poor solvent is added to wash the good solvent phase, and then separation of the poor solvent phase is performed. The step (R1a), (R1b), or (R2a) may be repeatedly carried out, or these steps may be carried out in combination.

No particular limitation is imposed on the poor solvent, so long as the copolymer is less likely to dissolve therein. Examples of the poor solvent include water, alcohols such as methanol and isopropanol, and saturated hydrocarbons such as hexane and heptane. No particular limitation is imposed on the good solvent, so long as the copolymer is likely to dissolve therein. Examples of the good solvent may be the same as those described above as polymerization solvents. A single good solvent or a mixture of two or more good solvents may be employed. The good solvent is preferably the same as a polymerization solvent, from the viewpoint of control of the production process.

(4) Step (S)

In step (S), low-boiling-point impurities are removed from a copolymer solution, or the original solvent is exchanged with a solvent suitable for a subsequent step or the composition for lithography. The step (S) may be, for example, a step (S1) in which a copolymer solution is concentrated with heating under reduced pressure, and optionally, a solvent is added to the solution, followed by further concentration; or a step (S2) in which a copolymer solution is optionally concentrated with heating under reduced pressure, subsequently, a solvent suitable for a subsequent step or the composition for lithography is supplied while the original solvent and the thus-supplied solvent are removed through evaporation, and optionally, further concentration is performed so as to replace the original solvent with the solvent suitable for the subsequent step or the composition for lithography.

The step (S) is carried out in the case where, for example, the solvent of the composition for lithography differs from the solvent of the polymer solution obtained through the steps (P) and (R), or undesirable impurities are contained in the composition for lithography. Preferably, the step (S) is carried out before the step (U) of preparing the composition for lithography.

The polymer solution may be temporarily formed into a solid through drying under reduced pressure without being subjected to the step (S), followed by dissolution of the solid in another solvent. However, this procedure is not preferred, since impurities or the solvent is likely to remain in the solid, or the copolymer undergoes thermal history more than necessary.

No particular limitation is imposed on the temperature of the step (S), so long as the copolymer is not degraded. Generally, the temperature is preferably 100° C. or lower, more preferably 80° C. or lower, much more preferably 70° C. or lower, particularly preferably 60° C. or lower. When the amount of a solvent newly supplied for solvent replacement is excessively small, low-boiling-point compounds cannot be sufficiently removed, whereas when the amount of the solvent is excessively large, a long period of time is required for solvent replacement, and the copolymer undergoes thermal history more than necessary, which is not preferred. The amount of the solvent is generally 1.05 to 10 times (preferably 1.1 to 5 times, particularly preferably 1.2 to 3 times) that of the solvent required for a finished solution.

(5) Step (T)

In step (T), metal components undesirable for semiconductor lithography are reduced in amount. The step (T) is optionally carried out, since metal components may enter the polymer solution from raw materials, sub-materials, apparatuses, or the environment, and the amount of the metal components may exceed an acceptable level for semiconductor formation. When the poor solvent employed in the step (R) is a polar solvent, the amount of metal components may be reduced in the step (R). In such a case, the step (R) may also serve as the step (T). Alternatively, the step (T) may be, for example, a step (T1) in which the polymer solution is brought into contact with a cation exchange resin; a step (T2) in which the polymer solution is brought into contact with a cation exchange resin, and an anion exchange resin or a mixture of acid-adsorbing resins; or a step (T3) in which the polymer solution is caused to pass through a filter containing a substance having a positive zeta potential (e.g., polyamide-polyamine-epichlorohydrin cationic resin). These steps may be carried out in combination. Examples of the filter employed in the step (T3) include products of Cuno Inc., such as Zeta Plus 40QSH, Zeta Plus 020GN, and Electropor IIEF.

(6) Step (U)

In step (U), undesirable microgels of high polymer or the like, which may cause pattern defects, are reduced in amount by causing the copolymer dissolved in an organic solvent to pass through a filter. The filtration accuracy of the filter employed is 0.2 µm or less, preferably 0.1 µm or less, particularly preferably 0.05 µm or less. Examples of the material of the filter include polyolefins such as polyethylene and polypropylene; polar-group-containing resins such as polyamide, polyester, and polyacrylonitrile; and fluorine-containing resins such as polyethylene fluoride. Among them, polyamide is particularly preferred. Examples of the polyamide filter include Ultipleat P-Nylon 66 and Ultipor N66 (products of Pall Corporation) and PhotoSHIELD and Electropor IIEF (products of Cuno Inc.). Examples of the polyethylene filter include Microguard Plus HC10 and Optimizer D (products of Nihon Entegris K.K.). These filters may be employed singly or in combination of two or more species.

4. Lithography Composition

The copolymer produced through the aforementioned method may be prepared into a composition for lithography through the following procedure: a dried solid of the copolymer is dissolved in one or more solvents for lithography, or a solution of the copolymer in a solvent for lithography is optionally diluted with the same or a different solvent for lithography; and the thus-prepared solution or diluted solution is mixed with required additives.

No particular limitation is imposed on the solvent for lithography, so long as it can dissolve components of the composition for lithography to give a uniform solution. The solvent for lithography employed may be any one of known solvents for lithography, or a mixture of two or more species of the solvents. Generally, the solvent for lithography may be selected from among the above-exemplified reaction solvents in the step (P) and the above-exemplified good solvents in the step (R), in consideration of, for example, solubility of components other than the copolymer, viscosity, boiling point, and absorption of radiation employed for lithography. Specific examples of preferred solvents for lithography include methyl amyl ketone, cyclohexanone, ethyl lactate (EL), γ-butyrolactone, and PGMEA. Of these, PGMEA is preferred, and a mixture of PGMEA and another polar solvent is particularly preferred. No particular limitation is imposed on the amount of the resist solvent contained in the resist composition. However, generally, the amount of the solvent is appropriately determined so that the copolymer concentration of the composition is such a level that it can be applied to, for example, a substrate, and so that the composition has an appropriate viscosity corresponding to application thickness. The amount of the solvent employed is determined so that the solid content of the resist composition is generally 2 to 20 mass %, preferably 5 to 15 mass %.

Taking a chemical amplification-type resist composition as an example, additives for preparing the composition for lithography will next be described. For preparing a chemical amplification-type resist composition, a radiation-sensitive acid-generator (X) (hereinafter may be referred to as a "component (X)"), an acid diffusion preventing agent (Y) (e.g., a nitrogen-containing organic compound) for preventing diffusion of an acid to a portion which is not irradiated (hereinafter may be referred to as a "component (Y)"), and an additional additive (Z) (hereinafter may be referred to as a "component (Z)") may be incorporated into the composition.

The component (X) may be appropriately selected from among radiation-sensitive acid-generators which have been proposed for chemical amplification-type resists. Examples of such a radiation-sensitive acid-generator include onium salts such as iodonium salts and sulfonium salts; oxime sulfonates; diazomethanes such as bisalkyl or bisarylsulfonyl-diazomethanes; nitrobenzyl sulfonates; iminosulfonates; and disulfones. Particularly preferred is an onium salt in which a fluorinated alkyl sulfonate ion serves as an anion. These agents may be employed singly or in combination of two or more species. The component (X) is generally incorporated in an amount of 0.5 to 30 parts by mass, preferably 1 to 10 parts by mass, on the basis of 100 parts by mass of the copolymer.

The component (Y) may be appropriately selected from among acid diffusion preventing agents which have been proposed for chemical amplification-type resists. Such an acid diffusion preventing agent may be a nitrogen-containing organic compound and is preferably a primary to tertiary alkylamine or a hydroxyalkylamine. Particularly preferred is a tertiary alkylamine or a tertiary hydroxyalkylamine; in particular, triethanolamine or triisopropanolamine. These agents may be employed singly or in combination of two or more species. The component (Y) is generally incorporated in an amount of 0.01 to 5.0 parts by mass on the basis of 100 parts by weight of the copolymer.

If necessary, the additional additive (component (Z)) may be appropriately added. Examples of the additive include compounds which have conventionally been used as additives for resists, such as organic carboxylic acids and phosphorus oxo acids for preventing reduction in sensitivity of an acid-generator or for improving, for example, the form of lithography patterns or post-exposure stability, additional resins for improving the performance of a resist film, surfactants for improving applicability of the composition, dissolution-inhibiting agents, plasticizers, stabilizers, coloring agents, antihalation agents, and dyes. Examples of the organic carboxylic acid include malonic acid, citric acid, malic acid, succinic acid, benzoic acid, and salicylic acid. These acids may be employed singly or in combination of two or more species. Such an organic carboxylic acid is incorporated in an amount of 0.01 to 5.0 parts by mass on the basis of 100 parts by mass of the copolymer.

EXAMPLES

The present invention will next be described in more detail by way of examples, which should not be construed as limiting the invention thereto. Abbreviations used in the below-described examples have the following meanings.
Monomers
monomer O: 3-Hydroxy-1-adamantyl methacrylate
monomer P: p-Hydroxystyrene
monomer M: 2-Methyl-2-adamantyl methacrylate
monomer N: 5-Methacryloyloxy-2,6-norbornanecarbolactone
monomer G: Glycidyl methacrylate
monomer A: 9-Anthrylmethyl methacrylate
monomer m: Methyl methacrylate

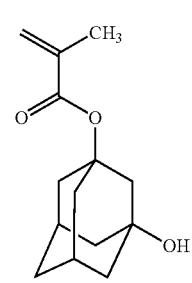
Monomer O

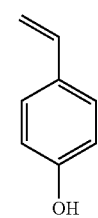
Monomer P

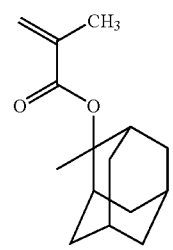
Monomer M

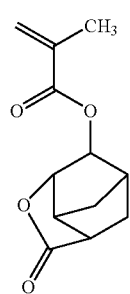
Monomer N

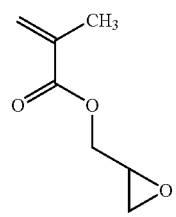
Monomer G

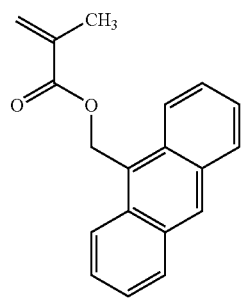
Monomer A

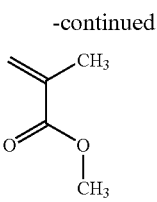

Monomer m

Repeating Units
G: Repeating unit derived from monomer O
... the aforementioned (A203)
P: Repeating unit derived from monomer P
... the aforementioned (A101)
M: Repeating unit derived from monomer M
... the aforementioned (B3107)
N: Repeating unit derived from monomer N
... the aforementioned (C105)
G: Repeating unit derived from monomer G
... the aforementioned (D101)
A: Repeating unit derived from monomer A
... the aforementioned (E123)
m: Repeating unit derived from monomer m
... the aforementioned (E101)
Polymerization Initiator
MAIB: Dimethyl-2,2'-azobisisobutyrate
Chain-Transfer Agent
TDM: t-Dodecylmercaptan
Solvents
MEK: Methyl ethyl ketone
THF: Tetrahydrofuran
PGMEA: Propylene glycol monomethyl ether acetate
EL: Ethyl lactate (1) Measurement of Mw and Mw/Mn of Copolymer (GPC)

The Mw and Mw/Mn of a copolymer were measured through GPC under the following analysis conditions.
  Apparatus: GPC 8220 (product of Tosoh Corporation)
  Detector: Differential refractive index (RI) detector
  Column: KF-804L (×3) (product of Showa Denko K.K.)
  Sample: A copolymer (about 0.02 g) was dissolved in tetrahydrofuran (about 1 mL). The amount of the sample applied to GPC was adjusted to 60 μL.

(2) Measurement of Repeating Unit Composition and End Composition of Copolymer ($^{13}$C-NMR)
  Apparatus: AV 400 (product of Bruker)
  Sample: Powder of a copolymer (about 1 g) and Cr(acac)$_2$ (0.1 g) were dissolved in MEK (0.5 g) and heavy acetone (1.5 g).
  Measurement: The sample was placed into a glass tube (inner diameter: 10 mm), and measurement was carried out at 40° C. (number of scans: 10,000).

(3) Measurement of Refining and Filtration Rate

A PGMEA solution containing each copolymer was diluted with PGMEA to a concentration to exhibit a viscosity of 15 mPa·sec at 25° C. The solution (100 g) was fed to a filtration apparatus (capacity: 200 mL) equipped with a filtration membrane employed in Microgard Plus HC10 (product of Nihon Entegris K.K.) (material: ultra-high-molecular-weight polyethylene; filtration precision: 0.03 μm; diameter: 47 mmφ; effective filtration pore diameter (in filtration apparatus): 44 mmφ, and effective filtration area (in filtration apparatus): 0.00152 m$^2$). While being maintained at 25° C., the solution was pressurized with nitrogen gas at a gauge pressure of 0.1 MPa, and this pressure was maintained for 60 minutes. The volume of PGMEA passed through filtration membrane was measured. The measurement of the same sample was performed thrice, and the average value was obtained.

(4) Appearance of Thin Film on Silicon Wafer

A solution of each copolymer was prepared so as to have the following composition based on a copolymer (100 parts by mass): component (Y) (Surflon S-381, product of Seimi Chemical Co. Ltd.) (0.1 parts by mass), and solvent for lithography (PGMEA) (750 parts by mass).

The solution was applied to a silicon wafer through spin-coating at a regulated speed of rotation, and the coated wafer was baked on a hot-plate at 100° C. for 90 seconds, to thereby form a thin film having a thickness of 300 to 400 nm. The appearance of the thin film was observed. A surface appearance in which lines attributable to microparticles (e.g., microgel) were observed was rated as "bad," and a uniform thin film surface in which no such lines were observed was rated as "good."

Example 1

To a monomer-dissolution tank (capacity: 200 L) having a glass lining and equipped with a jacket and an agitator, MEK (65.0 kg), monomer N (17.0 kg), monomer M (19.0 kg), and monomer O (9.0 kg) were fed. In a nitrogen atmosphere, the contents of the tank were dissolved under stirring, with hot water (30±2° C.) being caused to flow through the jacket, to thereby prepare a uniform "monomer solution." Separately, MEK (8.0 kg) and MAIB (4.0 kg) were fed to an initiator-dissolution tank (made of polyethylene, capacity of 20 L) equipped with an agitator, and the contents were stirred for dissolution, with the tank being immersed in a hot water tank maintained at 30±2° C., whereby a uniform "initiator solution" was prepared. Separately, MEK (30.0 kg) was fed to a polymerization tank (capacity: 200 L) having a glass lining and equipped with a jacket, an agitator having a full-zone impeller (product of Kobelco Eco-Solutions Co., Ltd.), and a condenser. During feeding, the polymerization tank was opened to air, with nitrogen was introduced at a small flow rate at the outlet of the condenser, whereby the inside of the tank was maintained in a nitrogen atmosphere.

MEK placed in the reactor tank was heated to 79.5° C. under stirring, with hot water maintained at 83.0±0.5° C. being caused to flow through the jacket. The conditions of MEK were maintained. Through continuously causing hot water (30±1° C.) to flow through the jacket of the monomer-dissolution tank, the temperature of the monomer solution was maintained at 30±1° C. until completion of the dropwise addition of the monomer solution. The initiator-dissolution tank was removed from the hot water tank, set in measuring apparatus, and allowed to be exposed to air at about 23° C. until completion of dropwise addition. While the conditions were maintained, the monomer solution and the initiator solution were separately added dropwise at a constant rate to the polymerization tank by means of fixed delivery pumps over 4 hours. During addition, the contents of the polymerization tank were stirred, and hot water (controlled at 83.0±0.5° C.) was continuously caused to flow through the jacket, whereby the inside temperature of the polymerization tank was maintained at 79 to 81° C. After completion of addition, the contents of the polymerization tank were stirred, and hot water (controlled at 83.0±0.5° C.) was continuously caused to flow through the jacket, whereby the inside temperature of the polymerization tank was maintained at 80° C. The contents were aged at 80° C. for two hours. The difference in temperature between hot water flowing through the jacket of the polymerization tank and the inside of the polymerization tank was found to be 2.9 to 3.8° C. Cooling water (about 20° C.) was caused to flow through the jacket, to thereby cool the contents to room temperature.

To a refining and filtration tank equipped with a jacket, an agitator, a filtration bed with a polyester filter cloth, and a discharge pipe with a valve disposed at the bottom of the filtration bed, methanol (15° C., 725 kg) and ultra-pure water (25 kg) were fed. The contents were stirred, with brine (15±1° C.) being caused to flow through the jacket, and the stirring state was maintained. The above-produced polymer liquid was added dropwise to the methanol-water mixture, to thereby precipitate a copolymer, and stirring was continued for 30 minutes. Subsequently, under continuous stirring, the liquid discharge valve disposed at the bottom of the filtration bed was opened, to thereby discharge the filtrate and recover a wet cake. Then, the liquid discharge valve disposed at the bottom of the filtration bed was closed, and methanol (15° C., 750 kg) was fed to the refining and filtration tank. The contents were maintained at 15° C. and stirred for 30 minutes. Under continuous stirring, the liquid discharge valve disposed at the bottom of the filtration bed was opened, to thereby discharge the filtrate and recover a wet cake. This operation was repeated. A portion (some grams) of the combined wet cake was removed, and dried at 60° C. or lower for one hour under reduced pressure, to thereby yield a dry powder. The repeating unit composition was determined through $^{13}$C-NMR.

Subsequently, the liquid discharge valve disposed at the bottom of the filtration bed was closed, and the remaining portion of the wet cake was dissolved with MEK (200 kg) fed thereto. Then, the solution was removed from the refining and filtration tank by opening the liquid discharge valve. The thus-removed solution was fed to a solvent-replace tank equipped with a jacket, an agitator, and a condenser. The solution was evacuated under stirring, and heated through a flow of hot water (55±1° C.) through the jacket. A portion of light fractions (e.g. MEK) was distilled off. Through evaporating the remaining portion of the light fractions and a portion of PGMEA while PGMEA was continuously added thereto, a PGMEA solution containing 25 mass % of the copolymer was yielded.

Through GPC analysis of the obtained PGMEA solution, Mw and Mw/Mn of the copolymer were determined. The filter passing rate was determined through the method as described above. Table 1 shows the results.

Example 2

To a monomer-dissolution tank (capacity: 200 L) having a glass lining and equipped with a jacket and an agitator, MEK (65.0 kg), monomer G (12.0 kg), monomer A (10.0 kg), and monomer m (20.0 kg) were fed. In a nitrogen atmosphere, the contents of the tank were dissolved under stirring, with hot water (30±2° C.) being caused to flow through the jacket, to thereby prepare a uniform "monomer solution." Separately, MEK (8.0 kg) and MAIB (4.0 kg) were fed to an initiator-dissolution tank (made of polyethylene, capacity of 20 L) equipped with an agitator, and the contents were stirred for dissolution, with the tank being immersed in a hot water tank maintained at 30±2° C., whereby a uniform "initiator solution" was prepared. Separately, MEK (30.0 kg) was fed to a polymerization tank (capacity: 200 L) having a glass lining and equipped with a jacket, an agitator having a triple retreated blade impeller (product of Kobelco Eco-Solutions Co., Ltd.), and a condenser. During feeding, the polymerization tank was opened to air, with nitrogen was introduced at a small flow rate at the outlet of the condenser, whereby the inside of the tank was maintained in a nitrogen atmosphere.

MEK placed in the polymerization tank was heated to 79.5° C. under stirring, with hot water maintained at 83.0±0.5° C. being caused to flow through the jacket. The conditions of MEK were maintained. Through continuously causing hot water (30±1° C.) to flow through the jacket of the monomer-dissolution tank, the temperature of the monomer solution was maintained at 30±1° C. until completion of the dropwise addition of the monomer solution. The initiator-dissolution tank was removed from the hot water tank, set in measuring apparatus, and allowed to be exposed to air at about 23° C. until completion of dropwise addition. While the conditions were maintained, the monomer solution and the initiator solution were separately added dropwise at a constant rate to the polymerization tank by means of fixed delivery pumps over 4 hours. During addition, the contents of the polymerization tank were stirred, and hot water (controlled at 83.0±0.5° C.) was continuously caused to flow through the jacket, whereby the inside temperature of the polymerization tank was maintained at 79 to 81° C. After completion of addition, the contents of the polymerization tank were stirred, and hot water (controlled at 83.0±0.5° C.) was continuously caused to flow through the jacket, whereby the inside temperature of the polymerization tank was maintained at 80° C. The contents were aged at 80° C. for two hours. The difference in temperature between hot water flowing through the jacket of the polymerization tank and the inside of the polymerization tank was found to be 2.6 to 4.7° C. Cooling water (about 20° C.) was caused to flow through the jacket, to thereby cool the contents to room temperature.

Hexane (23° C., 380 kg) was fed to a purification tank equipped with an agitator and stirred. The stirring state was maintained. The above-produced polymer liquid was added dropwise to hexane placed in the tank, to thereby precipitate a copolymer, and stirring was continued for 30 minutes, followed by allowing the mixture to stand for 30 minutes. The supernatant was discharged, and acetone (130 kg) was added to thereby dissolve the solid. A portion (some grams) of the thus-obtained solution was removed, and dried at 60° C. or lower for one hour under reduced pressure, to thereby obtain a dry powder of the copolymer. The repeating unit composition of the copolymer was determined through $^{13}$C-NMR.

The remaining portion of the solution was fed to a solvent-replace tank equipped with a jacket, an agitator, and a condenser. The solution was evacuated under stirring, and heated with a flow of hot water (55±1° C.) through the jacket. A portion of light fractions (e.g. acetone) was distilled off. Through evaporating the remaining portion of the light fractions and a portion of PGMEA while PGMEA was continuously added thereto, a PGMEA solution containing 25 mass % of the copolymer was yielded.

Through GPC analysis of the obtained PGMEA solution, Mw and Mw/Mn of the copolymer were determined. The filter passing rate was determined through the method as described above. Table 1 shows the results.

Example 3

To a monomer-dissolution tank (capacity: 200 L) having a glass lining and equipped with a jacket and an agitator, MEK (24.0 kg), monomer O (13.0 kg), and a chain-transfer agent (TDM) (1.0 kg) were fed. In a nitrogen atmosphere, the contents of the tank were dissolved under stirring, with hot water (30±2° C.) being caused to follow through the jacket, to thereby prepare a uniform "monomer solution." Separately, MEK (8.0 kg) and MAIB (4.0 kg) were fed to an initiator-dissolution tank (made of polyethylene, capacity of 20 L) equipped with an agitator, and the contents were stirred for dissolution, with the tank being immersed in a hot water tank maintained at 30±2° C., whereby a uniform "initiator solution" was prepared. Separately, a p-hydroxystyrene solution (110 kg) containing p-hydroxystyrene (25 mass %), p-ethyl phenol (41 mass %), water (10 mass %), and methanol (23 mass %) was fed to a polymerization tank (capacity: 200 L) having a glass lining and equipped with a jacket, an agitator having a triple retreated blade impeller (product of Kobelco Eco-Solutions Co., Ltd.), and a condenser. During feeding, the polymerization tank was opened to air, with nitrogen was introduced at a small flow rate at the outlet of the condenser, whereby the inside of the tank was maintained in a nitrogen atmosphere.

The p-hydroxystyrene solution placed in the polymerization tank was heated under stirring, with hot water maintained at 94±1° C. being caused to flow through the jacket. When the temperature inside the polymerization tank reached 78° C., the hot water flowing through the jacket was changed to hot water controlled to 83.0±0.5° C. The temperature inside the polymerization tank continuously elevated. When the temperature reached 80.0° C., the monomer solution and the initiator solution were separately added dropwise to the polymerization tank by means of fixed delivery pumps over 4 hours at a gradually decreasing rate. The contents were heated to 79.5° C., and the state was maintained. During addition, the contents of the polymerization tank were stirred, and hot water (controlled at 83.0±0.5° C.) was continuously caused to flow through the jacket. During the course of dropwise addition, the inside temperature of the polymerization tank gradually lowered as the methanol content of the polymerization tank increased. At the end of addition, the temperature was 74.10C. After completion of addition, the contents of the polymerization tank were further stirred, and hot water (controlled at 83.0±0.5° C.) was continuously caused to flow through the jacket, whereby the inside temperature of the polymerization tank was maintained at 74° C. The contents were aged for two hours. The difference in temperature between hot water flowing through the jacket of the polymerization tank and the inside of the polymerization tank was found to be 2.8 to 9.0° C. Cooling water (about 20° C.) was caused to flow through the jacket, to thereby cool the contents to room temperature.

Toluene (23° C., 400 kg) was fed to a purification tank equipped with an agitator and stirred. The stirring state was maintained. The above-produced polymer liquid was added dropwise to toluene placed in the tank, followed by stirring for 30 minutes. The mixture was allowed to stand for 30 minutes, to thereby separate it to two phases. A phase containing the copolymer (lower layer) was removed to another container, and a poor-solvent phase (upper layer) was discharged from the purification tank. The copolymer-containing phase was returned to the purification tank, and methanol (60 kg) was fed to the tank, followed by stirring. Thereafter, a procedure including feeding toluene (400 kg) to the purification tank, stirring for 30 minutes, allowing the mixture to stand for 30 minutes, removing the copolymer-containing phase (lower layer) to another container, and discharging the poor-solvent phase (lower layer) was repeatedly performed thrice. A portion (some grams) of the thus-obtained copolymer-containing phase was removed, and dried at 60° C. or lower for one hour under reduced pressure, to thereby obtain a dry powder of the copolymer. The repeating unit composition of the copolymer was determined through $^{13}$C-NMR.

The remaining portion of the copolymer-containing phase was fed to a solvent-replace tank equipped with a jacket, an agitator, and a condenser. The solution was evacuated under stirring, and heated with a flow of hot water (55±1° C.) through the jacket. A portion of light fractions (e.g. methanol) was distilled off. Through evaporating the remaining portion of the light fractions and a portion of PGMEA while PGMEA was continuously added thereto, a PGMEA solution containing 25 mass % of the copolymer was yielded.

Through GPC analysis of the obtained PGMEA solution, Mw and Mw/Mn of the copolymer were determined. The filter passing rate was determined through the method as described above. Table 1 shows the results.

Comparative Example 1 (NM)

The procedure of Example 1 was repeated, except that hot water controlled to 94±1° C. was caused to flow through the jacket of the polymerization tank. The difference in temperature between hot water flowing through the jacket of the polymerization tank and the inside of the polymerization tank was found to be 13.9 to 15.0° C.

Comparative Example 2 (AGm)

The procedure of Example 2 was repeated, except that hot water controlled to 94±1° C. was caused to flow through the jacket of the polymerization tank. The difference in temperature between hot water flowing through the jacket of the polymerization tank and the inside of the polymerization tank was found to be 13.7 to 15.2° C.

Comparative Example 3 (AOE)

The procedure of Example 3 was repeated, except that hot water controlled to 94±1° C. was caused to flow through the jacket of the polymerization tank. The difference in temperature between hot water flowing through the jacket of the polymerization tank and the inside of the polymerization tank was found to be 12.9 to 19.8° C.

TABLE 1

| | NMR mol % | | | | | | | GPC | | Refining and | |
| | O (A) | P (A) | M (B) | N (C) | G (D) | A (E) | m (E) | Mw | Mw/Mn | filtration rate g/min/m² | Appearance of thin film |
|---|---|---|---|---|---|---|---|---|---|---|---|
| Ex. 1 | 19.8 | | 38.9 | 41.3 | | | | 5,720 | 1.53 | 324 | good |
| Ex. 2 | | | | | 25.1 | 10.9 | 64.0 | 6,510 | 1.59 | 392 | good |
| Ex. 3 | 21.2 | 78.8 | | | | | | 8,050 | 1.45 | 306 | good |
| Comp. Ex. 1 | 19.7 | | 39.1 | 41.4 | | | | 5,690 | 1.54 | 112 | bad |
| Comp. Ex. 2 | | | | | 24.9 | 11.0 | 64.1 | 6,470 | 1.60 | 135 | bad |
| Comp. Ex. 3 | 21.0 | 79.0 | | | | | | 8,000 | 1.46 | 105 | bad |

A solution for lithography of each of the produced copolymers was prepared and applied onto a silicon wafer. The appearance of the thin film formed on the silicon wafer was evaluated. Thin films formed from a copolymer exhibiting a refining and filtration rate of 200 g/min/m² or more were found to have excellent appearance without failure in appearance which would otherwise be caused by formation of microgel or the like. When polymerization for forming copolymer (step (P)) was performed at a polymerization temperature equal to or higher than the initial boiling point of an ingredient serving as polymerization solvent and under solvent reflux conditions, copolymers having equivalent molecular weight and repeating unit composition (within analytical errors) were produced, regardless of the difference between the temperature of the heating medium fed to the jacket and the inside temperature of the polymerization system. However, only a copolymer produced at a difference between the temperature of the heating medium fed to the jacket and the inside temperature of the polymerization tank of 10° C. or less exhibited excellent appearance of the thin film formed therefrom.

The invention claimed is:

1. A copolymer for semiconductor lithography, comprising: at least one repeating unit selected from among (A) a repeating unit having a hydroxyl group; (B) a repeating unit having a structure in which a hydroxyl group is protected by a group which inhibits dissolution in an alkaline developer and which dissociates by the action of an acid; (C) a repeating unit having a lactone structure; and (D) a repeating unit having a cyclic ether structure, wherein, when a solution of the copolymer in propylene glycol monomethyl ether acetate having a viscosity of 15 mPa·sec at 25° C. in PGMEA is caused to pass through a filter having a pore size of 0.03 μm under a pressure difference of 0.1 MPa for 60 minutes, the solution exhibits an average flow rate per unit filter area of 200 g/min/m² or more.

2. A copolymer for semiconductor lithography, the copolymer being produced by dropwise addition, to a heated solvent, of at least one monomer selected from among a monomer for forming (A) a repeating unit having a hydroxyl group; a monomer for forming (B) a repeating unit having a structure in which a hydroxyl group is protected by a group which inhibits dissolution in an alkaline developer and which dissociates by the action of an acid; a monomer for forming (C) a repeating unit having a lactone structure; and a monomer for forming (D) a repeating unit having a cyclic ether structure, and a polymerization initiator, to thereby polymerize the monomer(s), in a polymerization tank having a capacity of 100 L or more and equipped with at least a jacket for supplying a heating medium, an agitator, and a condenser, wherein the temperature of the heating medium supplied to the jacket is controlled so as not to exceed a temperature which is 10° C. higher than the polymerization temperature at least during dropwise addition of the monomer.

3. The copolymer for semiconductor lithography according to claim 1, wherein the repeating unit (A) comprises at least one structure selected from among formula (A1):

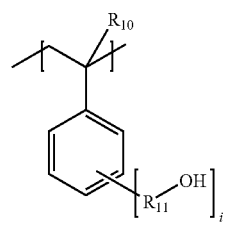

(wherein $R_{10}$ represents a hydrogen atom or a C1-C4 hydrocarbon group which may be substituted by a fluorine atom; $R_{11}$ represents a single bond or a C1-C4 divalent hydrocarbon group which may be substituted by a fluorine atom; and i is an integer of 1 or 2), formula (A2):

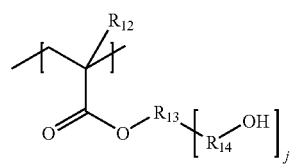

(wherein $R_{12}$ represents a hydrogen atom or a C1-C4 hydrocarbon group which may be substituted by a fluorine atom; $R_{13}$ represents a C2-C12 2- to 4-valent hydrocarbon group which may include a fluorine atom, an oxygen atom, or a sulfur atom; $R_{14}$ represents a single bond or a C1-C4 divalent hydrocarbon group which may be substituted by a fluorine atom; and j is an integer from 1 to 3), and formula (A3):

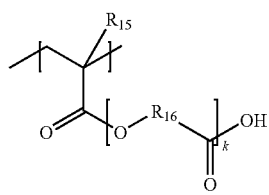

(wherein $R_{15}$ represents a hydrogen atom or a C1-C4 hydrocarbon group which may be substituted by a fluorine atom; $R_{16}$ represents a C6-C12 divalent alicyclic hydrocarbon group which may include an oxygen atom or a sulfur atom; and k is an integer of 0 or 1).

4. The copolymer for semiconductor lithography according to claim 1, wherein the repeating unit (B) comprises a structure in which a hydroxyl group in the repeating unit (A) is protected by at least one acid-dissociable dissolution-inhibitive group selected from formula (b1):

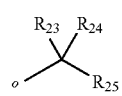

(wherein o represents a binding site of formula (1); each of $R_{23}$ and $R_{24}$ independently represents a C1-C4 hydrocarbon group; $R_{25}$ represents a C1-C12 hydrocarbon group; and $R_{25}$ may be linked to $R_{23}$ or $R_{24}$ to form a ring) and formula (b2):

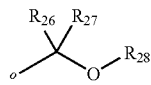

(b2)

(wherein o represents a binding site of formula (b2); each of $R_{26}$ and $R_{27}$ independently represents a hydrogen atom or a C1-C4 hydrocarbon group; $R_{28}$ represents a C1-C12 hydrocarbon group; and $R_{26}$ may be linked to $R_{27}$ or $R_{28}$ to form a ring).

5. The copolymer for semiconductor lithography according to claim 1, wherein the repeating unit (C) comprises a structure represented by formula (C1):

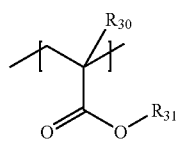

(C1)

[wherein $R_{30}$ represents a hydrogen atom or a C1-C4 hydrocarbon group which may be substituted by a fluorine atom; $R_{31}$ represents a structure represented by formula (c):

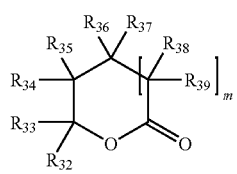

(c)

(wherein any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group; or any one of $R_{32}$ to $R_{39}$ represents a C3-C12 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the C5-C15 alicyclic ring; and the further remaining ones of $R_{32}$ to $R_{39}$ each represent a hydrogen atom or a C1-C4 hydrocarbon or alkoxy group; and m is an integer of 0 or 1)].

6. The copolymer for semiconductor lithography according to claim 1, wherein the repeating unit (D) comprises a structure represented by formula (D1):

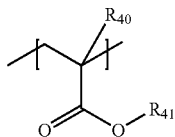

(D1)

(wherein $R_{40}$ represents a hydrogen atom or a C1-C4 hydrocarbon group which may be substituted by a fluorine atom; and $R_{41}$ represents a C3-C7 hydrocarbon group having a 3- to 6-membered cyclic ether structure).

7. A method for producing the copolymer for semiconductor lithography, the method comprising dropwise addition, to a heated solvent, at least one monomer selected from among a monomer for forming (A) a repeating unit having a hydroxyl group; a monomer for forming (B) a repeating unit having a structure in which a hydroxyl group is protected by a group which inhibits dissolution in an alkaline developer and which dissociates by the action of an acid; a monomer for forming (C) a repeating unit having a lactone structure; and a monomer for forming (D) a repeating unit having a cyclic ether structure, and a polymerization initiator, to thereby polymerize the monomer(s), in a polymerization tank having a capacity of 100 L or more and equipped with at least a jacket for supplying a heating medium, an agitator, and a condenser, wherein the temperature of the heating medium supplied to the jacket is controlled so as not to exceed a temperature which is 10° C. higher than the polymerization temperature at least during dropwise addition of the monomer.

8. The method for producing the copolymer for semiconductor lithography according to claim 7, wherein the polymerization temperature is adjusted to a temperature equal to or higher than the initial boiling point of a component contained as a polymerization solvent.

9. The method for producing the copolymer for semiconductor lithography according to claim 7, wherein the monomer and the polymerization initiator are separately added to the heated solvent.

10. The method for producing the copolymer for semiconductor lithography according to claim 7, wherein the monomer is preliminarily heated to 25° C. or higher before dropwise addition to the solvent.

11. The copolymer for semiconductor lithography according to claim 2, wherein the repeating unit (A) comprises at least one structure selected from among formula (A1):

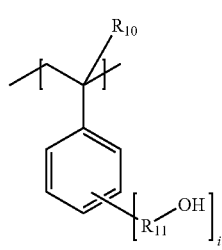

(A1)

(wherein $R_{10}$ represents a hydrogen atom or a C1-C4 hydrocarbon group which may be substituted by a fluorine atom; $R_{11}$ represents a single bond or a C1-C4 divalent hydrocarbon group which may be substituted by a fluorine atom; and i is an integer of 1 or 2), formula (A2):

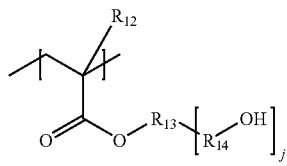

(A2)

(wherein $R_{12}$ represents a hydrogen atom or a C1-C4 hydrocarbon group which may be substituted by a fluorine atom; $R_{13}$ represents a C2-C12 2- to 4-valent hydrocarbon group which may include a fluorine atom, an oxygen atom, or a sulfur atom; $R_{14}$ represents a single bond or a C1-C4 divalent hydrocarbon group which may be substituted by a fluorine atom; and j is an integer from 1 to 3), and formula (A3):

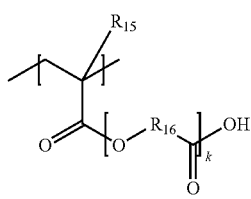

(A3)

(wherein $R_{15}$ represents a hydrogen atom or a C1-C4 hydrocarbon group which may be substituted by a fluorine atom; $R_{16}$ represents a C6-C12 divalent alicyclic hydrocarbon group which may include an oxygen atom or a sulfur atom; and k is an integer of 0 or 1).

12. The copolymer for semiconductor lithography according to claim 2, wherein the repeating unit (B) comprises a structure in which a hydroxyl group in the repeating unit (A) is protected by at least one acid-dissociable dissolution-inhibitive group selected from formula (1)1):

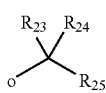

(b1)

(wherein o represents a binding site of formula (b1); each of $R_{23}$ and $R_{24}$ independently represents a C1-C4 hydrocarbon group; $R_{25}$ represents a C1-C12 hydrocarbon group; and $R_{25}$ may be linked to $R_{23}$ or $R_{24}$ to form a ring) and formula (b2):

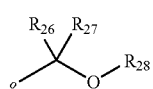

(b2)

(wherein o represents a binding site of formula (b2); each of $R_{26}$ and $R_{27}$ independently represents a hydrogen atom or a C1-C4 hydrocarbon group; $R_{28}$ represents a C1-C12 hydrocarbon group; and $R_{26}$ may be linked to $R_{27}$ or $R_{28}$ to form a ring).

13. The copolymer for semiconductor lithography according to claim 2, wherein the repeating unit (C) comprises a structure represented by formula (C1):

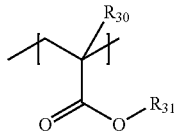

(C1)

[wherein $R_{30}$ represents a hydrogen atom or a C1-C4 hydrocarbon group which may be substituted by a fluorine atom; $R_{31}$ represents a structure represented by formula (c):

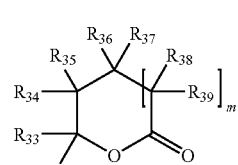

(c)

(wherein any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group; or any one of $R_{32}$ to $R_{39}$ represents a C3-C12 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the C5-C15 alicyclic ring; and the further remaining ones of $R_{32}$ to $R_{39}$ each represent a hydrogen atom or a C1-C4 hydrocarbon or alkoxy group; and m is an integer of 0 or 1)].

14. The copolymer for semiconductor lithography according to claim 2, wherein the repeating unit (D) comprises a structure represented by formula (D1):

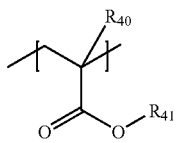

(D1)

(wherein $R_{40}$ represents a hydrogen atom or a C1-C4 hydrocarbon group which may be substituted by a fluorine atom; and $R_{41}$ represents a C3-C7 hydrocarbon group having a 3- to 6-membered cyclic ether structure).

15. The method according to claim 7, wherein the copolymer for semiconductor lithography comprises at least one repeating unit selected from among (A) a repeating unit having a hydroxyl group; (B) a repeating unit having a structure in which a hydroxyl group is protected by a group which inhibits dissolution in an alkaline developer and which dissociates by the action of an acid; (C) a repeating unit having a lactone structure; and (D) a repeating unit having a cyclic ether structure, wherein, when a solution of the copolymer in propylene glycol monomethyl ether acetate having a viscosity of 15 mPa·sec at 25° C. in PGMEA is caused to pass through a filter having a pore size of 0.03 μm under a pressure difference of 0.1 MPa for 60 minutes, the solution exhibits an average flow rate per unit filter area of 200 g/min/m² or more.

* * * * *

UNITED STATES PATENT AND TRADEMARK OFFICE
CERTIFICATE OF CORRECTION

PATENT NO. : 7,960,494 B2  Page 1 of 1
APPLICATION NO. : 12/516489
DATED : June 14, 2011
INVENTOR(S) : Takanori Yamagishi et al.

It is certified that error appears in the above-identified patent and that said Letters Patent is hereby corrected as shown below:

Column 60, Claim 4, line 65, "(wherein o represents a binding site of formula (1);

should read

--(wherein o represents a binding site of formula (1b)--.

Column 63, Claim 12, line 40, "hibitive group selected from formula (1)1):"

should read

--hibitive group selected from formula (1b)--.

Signed and Sealed this
Thirteenth Day of September, 2011

David J. Kappos
*Director of the United States Patent and Trademark Office*